United States Patent
Matsui et al.

(10) Patent No.: US 7,700,489 B2
(45) Date of Patent: Apr. 20, 2010

(54) METHOD OF MANUFACTURING A SEMICONDUCTOR DEVICE

(75) Inventors: Yukiteru Matsui, Yokohama (JP); Gaku Minamihaba, Yokohama (JP); Hiroyuki Yano, Yokohama (JP); Atsushi Shigeta, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 945 days.

(21) Appl. No.: 10/935,429

(22) Filed: Sep. 8, 2004

(65) Prior Publication Data

US 2005/0106874 A1 May 19, 2005

(30) Foreign Application Priority Data

Sep. 12, 2003 (JP) .............................. P2003-321474
Sep. 6, 2004 (JP) .............................. P2004-258030

(51) Int. Cl.
*H01L 21/302* (2006.01)
(52) U.S. Cl. ..................... 438/693; 438/691; 438/692; 216/89
(58) Field of Classification Search ................ 438/692, 438/693, 691; 216/88, 89
See application file for complete search history.

(56) References Cited

U.S. PATENT DOCUMENTS

| | | | |
|---|---|---|---|
| 5,532,191 A * | 7/1996 | Nakano et al. ............... 438/692 |
| 6,046,112 A * | 4/2000 | Wang ........................... 438/693 |
| 6,224,464 B1 * | 5/2001 | Nojo et al. ..................... 451/41 |
| 6,343,976 B1 | 2/2002 | Yoshida et al. | |
| 6,419,557 B2 * | 7/2002 | Nojo et al. ..................... 451/41 |
| 6,420,269 B2 * | 7/2002 | Matsuzawa et al. .......... 438/693 |
| 6,443,811 B1 * | 9/2002 | Nojo et al. ..................... 451/41 |
| 6,514,862 B2 | 2/2003 | Lee et al. | |
| 6,562,416 B2 * | 5/2003 | Ngo et al. .................... 427/534 |
| 6,776,810 B1 * | 8/2004 | Cherian et al. ................. 51/307 |
| 6,786,945 B2 * | 9/2004 | Machii et al. .................. 51/307 |
| 2003/0022052 A1 * | 1/2003 | Kearl ............................ 429/34 |
| 2003/0162399 A1 * | 8/2003 | Singh .......................... 438/692 |
| 2003/0194868 A1 * | 10/2003 | Miller ......................... 438/689 |
| 2004/0055993 A1 * | 3/2004 | Moudgil et al. ................ 216/2 |

FOREIGN PATENT DOCUMENTS

| | | | |
|---|---|---|---|
| JP | 2001-007061 | * | 1/2001 |
| JP | 3278532 | | 2/2002 |
| JP | 2002-190458 | * | 7/2002 |
| JP | 2003-113370 | | 4/2003 |
| KR | 2002-0007607 | | 1/2002 |
| WO | WO 03/072683 A1 | | 9/2003 |

OTHER PUBLICATIONS

Notice of Requesting Submission of Opinion from Korean Intellectual Property Office dated Mar. 17, 2006, in counterpart Korean application No. 10-2004-72936, and English language translation thereof.
Notice of Rejection issued by the Japanese Patent Office on Oct. 3, 2006, for Japanese Patent Application No. 2004-258030, and English-language translation thereof.

* cited by examiner

*Primary Examiner*—Lan Vinh
(74) *Attorney, Agent, or Firm*—Finnegan, Henderson, Farabow, Garrett & Dunner, L.L.P.

(57) ABSTRACT

A method of manufacturing a semiconductor device includes depositing a $SiO_2$ film on the substrate having formed thereon a wiring pattern; coating a SOG film on the $SiO_2$ film; and polishing the SOG film using a slurry containing cerium oxide and cationic surfactant with a chemical-mechanical polishing process.

14 Claims, 14 Drawing Sheets

METHOD OF MANUFACTURING A SEMICONDUCTOR DEVICE

CROSS-REFERENCE TO RELATED APPLICATION

This application claims benefit of priority based on Japanese Patent Applications filed previously by the applicant, namely, Japanese Patent Application Nos. 2003-321474 (filing date: Sep. 12, 2003) and 2004-258030(filing date: Sep. 6, 2004), the contents of which are herein incorporated by reference.

BACKGROUND OF THE INVENTION

1. Field of the Invention

The present invention relates to a method of manufacturing a semiconductor device. More particularly, the invention concerns a method of polishing for planarization when manufacturing a semiconductor device.

2. Description of the Related Art

Nowadays, in the process of executing multi-layer wiring, a lot of use has been made of a step wherein after forming a wiring pattern on a relevant substrate, an insulation film is formed and the surface of the resulting mass is planarized using a chemical-mechanical polishing process (hereinafter, referred to as "the CMP").

The outline of the multi-layer wiring process will now be explained using FIG. 1A. First, on a wiring pattern 102 on which a substrate 101 is formed, there is formed a $SiO_2$ film 103 that serves as a protection/adhesion layer for the wiring pattern 102. On the resultant $SiO_2$ film 103, there is coated and embedded an Spin on glass (SOG) film 104. Thereafter, CMP is performed with respect to the SOG film 104 under the conditions that the polishing selectivity can be set between the SOG film 104 and the $SiO_2$ film 103, thereby performing planarization.

Also, in another form of example, as illustrated in FIG. 2A, on a substrate having a wiring pattern 102 formed thereon, a $SiO_2$ film 103 that serves as a protection/adhesion layer for the wiring pattern 102 is formed, and CMP is performed with respect to the resultant $SiO_2$ film 103, thereby performing planarization.

It has hitherto been proposed that for CMP with respect to these insulation films 103, 104 there be used slurry using silica or cerium oxide as the polishing particles, further a slurry prepared by adding thereto anionic or nonionic surfactant.

However, in the earlier techniques, as described below, the problems that are to be improved remained unsolved.

As illustrated in FIGS. 1B and 1C, in a case where, using, for example, a slurry containing cerium oxide 105 and anionic surfactant 108, performing CMP by relatively moving a polishing pad 107 and the substrate 101, since the polishing selectivity of the SOG film 104 to the $SiO_2$ film 103 is low, the $SiO_2$ film 103 is eliminated, which tends to scratch the wiring pattern.

Especially, as the wiring becomes micronized, the thickness of the $SiO_2$ film 103 tends to be made thinner and, therefore, it was fairly difficult to polish the SOG film 104 so that the $SiO_2$ film 103 that had been made thin was not eliminated.

Also, as illustrated in FIG. 2B, in a case where there is used the slurry of the earlier technology, containing the cerium oxide 105 and anionic surfactant 108, polishing particles were easy to leave behind on the surface of the insulation film.

SUMMARY OF THE INVENTION

An aspect of the present invention inheres in a method of manufacturing a semiconductor device which comprises depositing a $SiO_2$ film on the substrate having formed thereon a wiring pattern, coating a SOG film on the $SiO_2$ film, and, using a slurry containing cerium oxide and cationic surfactant, polishing the SOG film.

Another aspect of the present invention inheres in a method of manufacturing a semiconductor device which comprises depositing a $SiO_2$ film on the substrate having a wiring pattern thereon; and polishing the $SiO_2$ film, using slurry containing cerium oxide and a cationic surfactant such that the hydrophobic part of the surfactant is an oligomer or polymer having a mass average molecular weight of 500 or more, with a chemical-mechanical polishing process.

DETAILED DESCRIPTION OF THE PREFERRED EMBODIMENTS

Figure 1A:
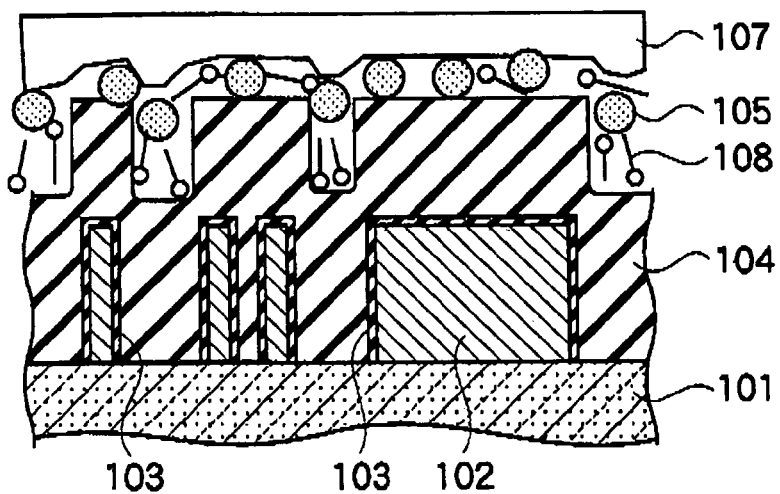
FIGS. 1A, 1B, and 1C are conceptual views illustrating a earlier method of manufacturing a semiconductor device.

Hereinafter, embodiments of the present invention will be explained with reference to the drawings. It is to be noted that like components as those which will be explained in a first embodiment are designated by like reference numerals and the explanation that is relevant thereto is omitted. The present invention is not limited to the embodiments that are described below.

First Embodiment (Deposition Step)

Figure 3A:
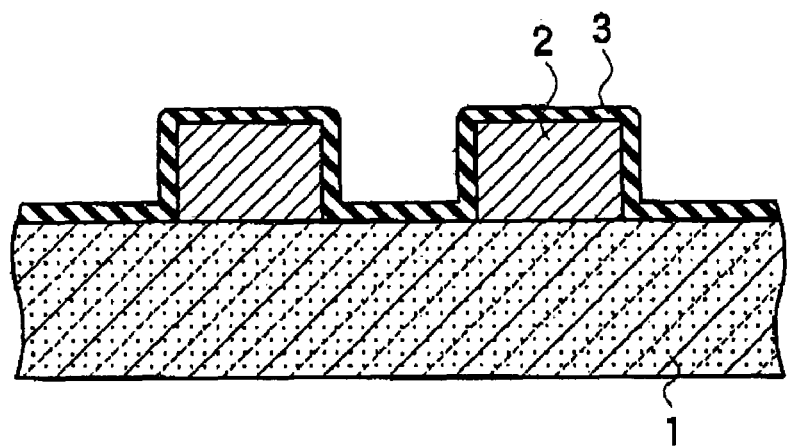
FIGS. 3A, 3B, and 3C are schematic sectional views illustrating the process steps of the method of manufacturing a semiconductor device according to a first embodiment of the present invention.

As illustrated in FIG. 3A, on a wafer substrate 1 having formed thereon a wiring pattern 2, there is deposited a $SiO_2$ film 3. "The $SiO_2$ film 3" is referred to as silicon dioxide film that is deposited on the part that includes the surface of the wiring pattern 2. The $SiO_2$ film 3 is not particularly limited if the $SiO_2$ film 3 is able to sufficiently insulate the wiring pattern 2 and has an excellent polishing selectivity between $SiO_2$ film 3 and a SOG film 4 that will be described later, i.e., it is a type wherein the polishing rate for the $SiO_2$ film 3 is lower than that for the SOG film 4. As the $SiO_2$ film 3, for example a TEOS film or a $SiH_4$-based oxide film can be used. Above all, it is preferable to use the TEOS film. There as on why having selected the TEOS film is because of an excellent level of step coverage thereof and that, as will be explained using FIG. 7, when performing CMP with respect thereto by using a slurry containing cerium oxide and a surfactant, the $SiO_2$ film 3 and SOG film 4 such as an MSQ film can be polished with an excellent polishing selectivity.

The method of forming the $SiO_2$ film 3 is not particularly limited. However, as that method, there can be taken up as an example a plasma CVD process that uses TEOS and $O_2$, an atmospheric CVD process that uses TEOS and $O_3$, or a thermal CVD process that uses $SiH_4$ and $O_2$. Saying from the standpoint of having a high embedding ability and being wide in terms of the range in which it can be applied, using the plasma CVD process is preferable. From the standpoint of it's having an excellent level of step coverage, using the atmospheric CVD processor thermal CVD process is preferable. Among others, using the plasma CVD process is preferable from the standpoint of the embedding property for an insulation film that is obtained.

(Coating Step)

Figure 3B:
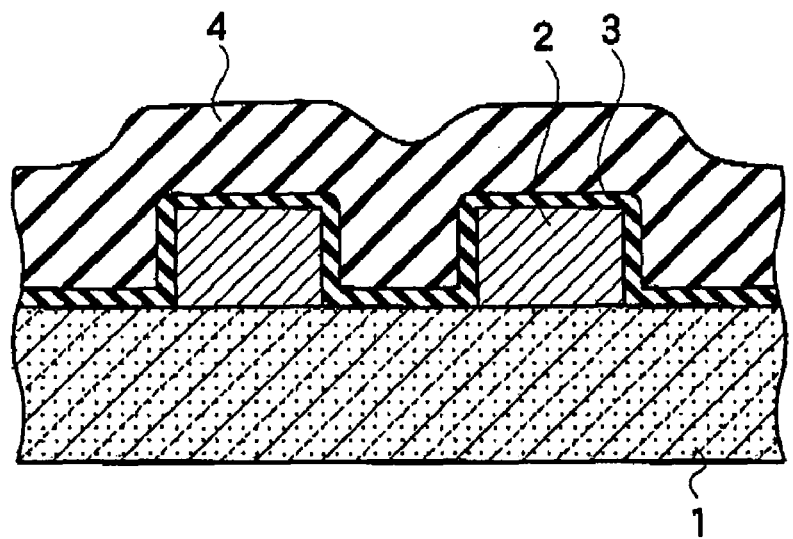

As illustrated in FIG. 3B, on the substrate having formed thereon the $SiO_2$ film 3, the SOG film 4 is coated. The term "SOG film 4" refers to a film that is formed on the $SiO_2$ film 3 using an organic coating material or inorganic coating material. That is to say, the $SiO_2$ film 3 and SOG film 4 are distinguished from each other. As the SOG film 4, from the standpoint of preventing the delay due to the wiring as well as of speeding up a relevant signal, it is preferable to use a material of low dielectric constant (Low-k). Specifically, it is possible to use a material having siloxane skeleton, for example, an organic coating material such as MSQ and porous MSQ, and an inorganic coating material such as hydrogen silsesquioxane (HSQ) and porous HSQ. Also, it is possible to use a material containing organic resin as major component, such as polyallylene ether, polybenzoxazole and polybenzocyclobutene. These materials are commercially available under the trade names that will be given below. For example, there can be used OCD T-9 (produced by Tokyo Ohka Kogyo Co., Ltd., the dielectric constant=2.7 and the heat-resistant temperature=600° C.), LKD-T200 (produced by JSR, the dielectric constant=2.7 to 2.5 and the heat-resistant temperature=450° C.), HOSP (produced by Honeywell Electronic Materials Company in USA), the dielectric constant=2.5 and the heat-resistant temperature=550° C.), HSG-RZ25 (produced by Hitachi Chemical Co., Ltd., the dielectric constant=2.5 and the heat-resistant temperature=650° C.), or OCL T-31 (produced by Tokyo Ohka Kogyo Co., Ltd., the dielectric constant=2.3 and the heat-resistant temperature=500° C.), or LKD-T400 (produced by JSR, the dielectric constant=2.2 to 2 and the heat-resistant temperature=450° C.).

As the porous MSQ-based material, there can be used, for example, HSG-6211X (produced by Hitachi Chemical Co., Ltd., the dielectric constant=2.4 and the heat-resistant temperature=650° C.), ALCAP-S (produced by Asahi Kasei Corporation, the dielectric constant=2.3 to 1.8 and the heat-resistant temperature=450° C.), OCL T-77 (produced by Tokyo Ohka Kogyo Co., Ltd., the dielectric constant=2.2 to 1.9 and the heat-resistant temperature=600° C.), HSG-6210X (produced by Hitachi Chemical Co., Ltd., the dielectric constant=2.1 and the heat-resistant temperature=650° C.) or silica aerogel (produced by Kobe Steel, Ltd., the dielectric constant=1.4 to 1.1). As the porous-organic material, there can be taken up as an example Poly ELK (produced by Air Product Standard Chemicals Inc. in USA), the dielectric constant=2 or less and the heat-resistant temperature=490° C.). As the coating technique, it is not particularly limited but permits the use of any earlier known techniques. For example, it is possible to use a spin-coating technique.

(Polishing Step)

Figure 3C:
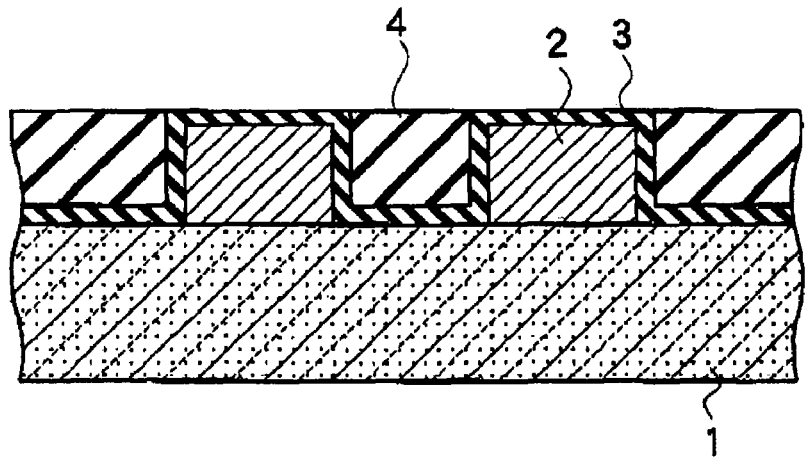

As illustrated in FIG. 3C, using a slurry containing cerium oxide and cationic surfactant, by means of the CMP process, the SOG film 4 is CMP-polished until the surfaces of the $SiO_2$ film 3 and SOG film 4 become level with each other. The CMP processing at this time is performed, while the slurry is being supplied onto the polishing pad, through making relative movement between the wafer as a substrate and the polishing pad. By performing CMP processing by using the slurry containing cerium oxide and cationic surfactant, it is possible to selectively polish the SOG film 4 relative to the $SiO_2$ film 3.

Figure 1B:
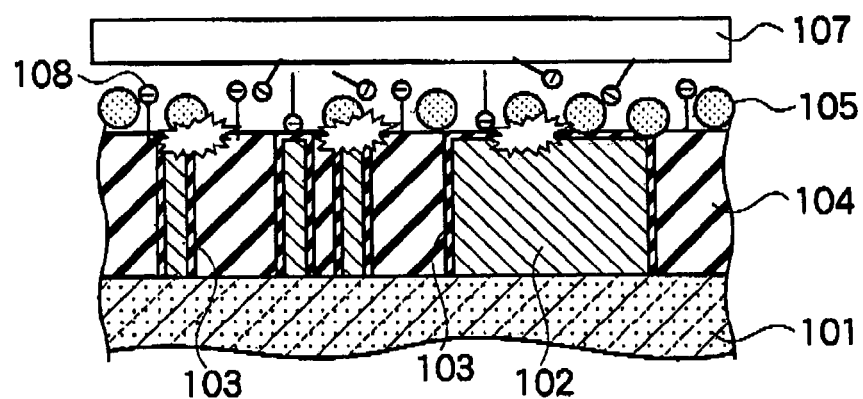
Figure 1C:
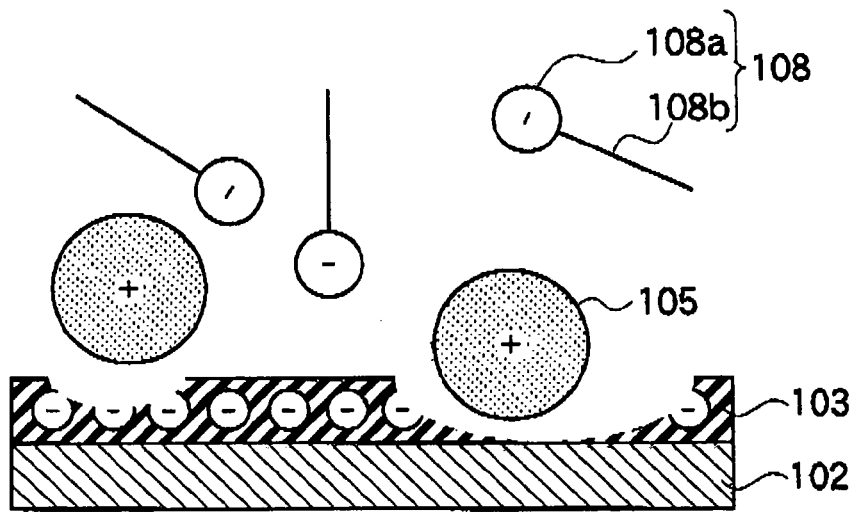
Figure 2A:
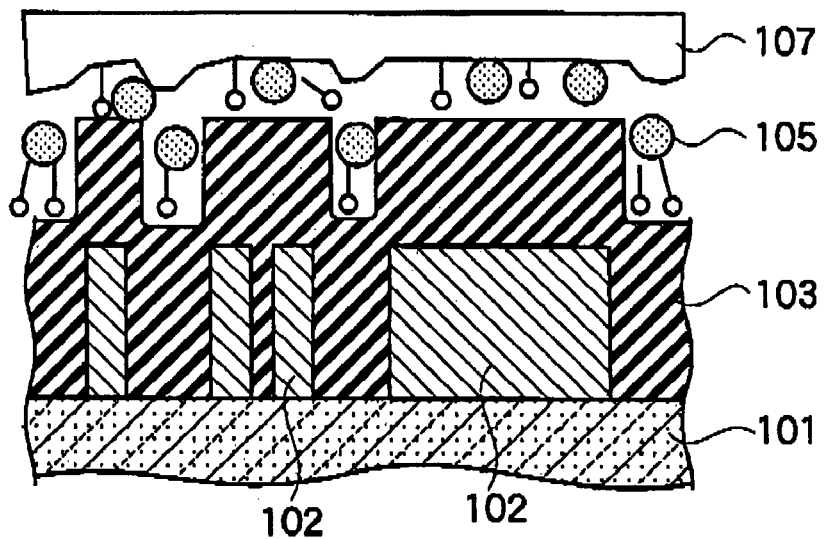
FIGS. 2A and 2B are conceptual views illustrating the earlier method of manufacturing a semiconductor device.
Figure 2B:
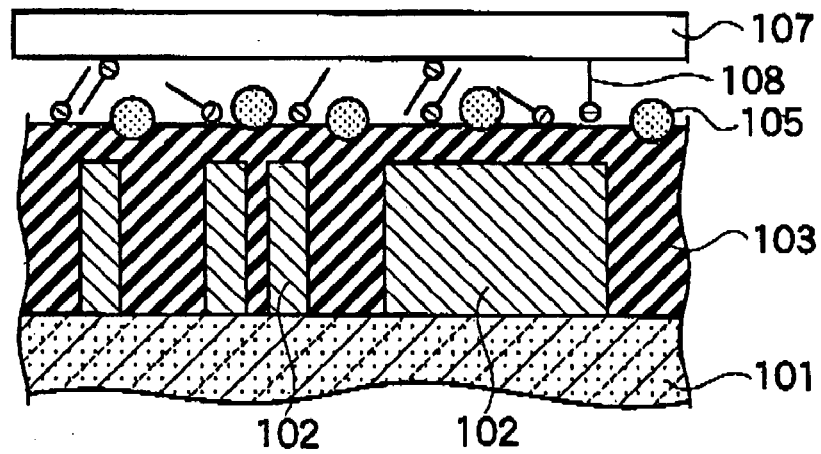
Figure 4A:
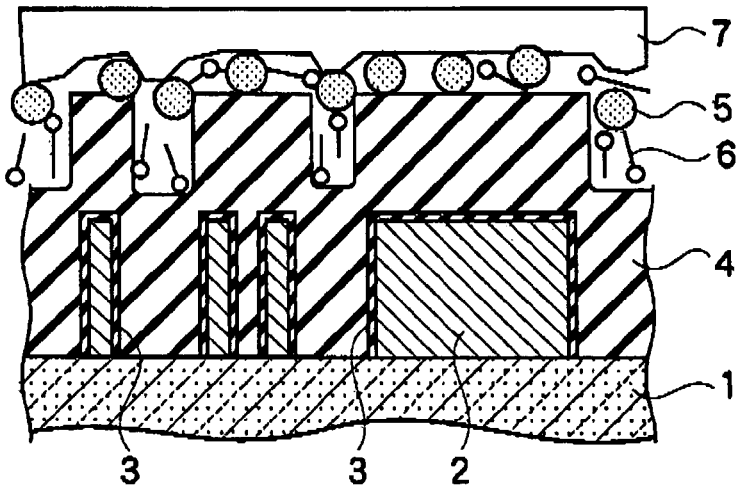
FIGS. 4A, 4B, and 4C are conceptual views illustrating the method of manufacturing a semiconductor device according to the first embodiment of the present invention.

Although the reason why the SOG film 4 can be selectively polished is not clear in particular, it can be explained as follows using the conceptual views for process steps that are given from FIG. 4A to FIG. 4C and from FIG. 1A to FIG. 1C. As illustrated in the FIG. 4C and FIG. 1C sectional views, partly enlarged, of the substrate, since the $SiO_2$ film 3 and 103 such as the TEOS film is hydrophilic, it is thought that the surface thereof is negatively charged. As illustrated in FIG. 1B and FIG. 1C, in a case where anionic surfactant 108 is contained in the slurry, since a hydrophilic part 108a of its hydrophilic part 108a and hydrophobic part 108b is negatively charged, the hydrophilic part 108a has less electrical interaction between hydrophilic part 108a and the $SiO_2$ film 103. Therefore, the anionic surfactant 108 is not adsorbed to the $SiO_2$ film 103.

Figure 4B:
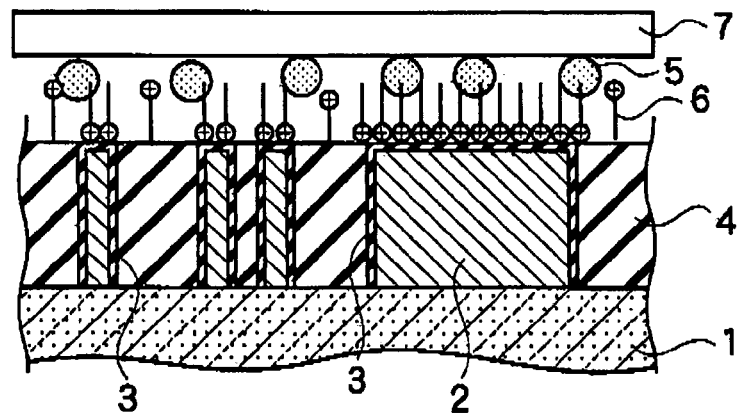
Figure 4C:
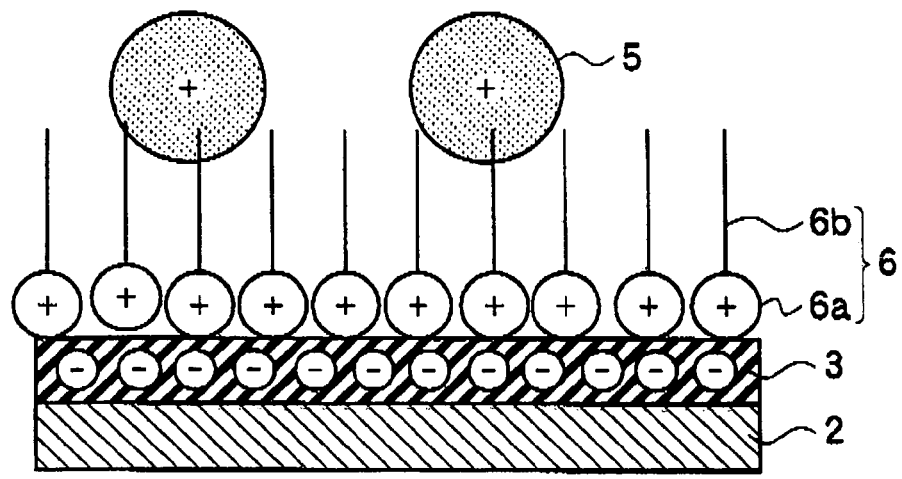

In contrast, as illustrated in FIGS. 4B and 4C, in a case where cationic surfactant 6 is contained in slurry, since a hydrophilic part 6a of its hydrophilic part 6a and hydrophobic part 6b is positively charged, hydrophilic part 6a has strong electrical interaction between hydrophilic part 6a and the $SiO_2$ film 3 that is negatively charged. For this reason, a film of the cationic surfactant 6 is formed on the surface of the $SiO_2$ film 3, whereby that surface becomes positively charged. As the result, the cerium oxide that has been positively charged has difficulty coming near to the surface of the $SiO_2$ film 3, with the result that it is thought that the polishing rate for the $SiO_2$ film 3 is effectively suppressed.

On the other hand, regarding the interaction between the SOG film 4 and the cationic surfactant 6, since the SOG film 4 is hydrophobic, the SOG film 4 has no interaction between the hydrophilic part 6a of the surfactant 6. For this reason, the SOG film 4 interacts with the hydrophobic part 6b of the surfactant 6 and it is thought that planarization proceeds through a mechanism that is earlierly known. As a result, it is thought that in the polishing step the SOG film 4 is selectively polished relative to the $SiO_2$ film 3.

By having provided the planarization step that is executed with the chemical-mechanical polishing process that uses the slurry containing cerium oxide and at least one kind of cationic surfactant, there are obtained the function and effect that the $SiO_2$ film 3 and SOG film 4 can be selectively polished with the polishing selectivity value of 5 or more. Above all, the value of polishing selectivity that is necessary when using the TEOS film as the $SiO_2$ film 3 and the MSQ film as the SOG film 4 is at least 4.5, preferably 10 or more.

As the cationic surfactant contained in the polishing solution (slurry), there can be used, for example, simple amine salts containing primary to tertiary amines that are capable of producing salts, denatured salts, quaternary ammonium salts, onium compounds such as phosphonium salts and sulfonium salts, and cyclic nitrogen compounds and heterocyclic compounds such as pyridinium salts, quinolinium salts and imidazolinium salts. Specifically, there can be used alkylamine acetate, cetyltrimethylammonium chloride (cetyltrimethylammonium chloride: CTAC), lauryltrimethylammonium chloride, cetyltrimethylammonium bromide (CTAB), cetylpyridinium bromide chloride, dodecylpyridinium chloride, alkylnaphthalene pyridinium chloride, or the like.

Also, from the standpoint of that surfactant containing quaternary ammonium salts is strongly adsorbed to the TEOS film and has a remarkable effect of suppressing the polishing rate at which to polish the TEOS film, the surfactant containing quaternary ammonium salts can be suitably used. Concretely, as the quaternary ammonium salts, there can be taken up as examples a quaternary ammonium compound or the like that are expressed by the following formula (1):

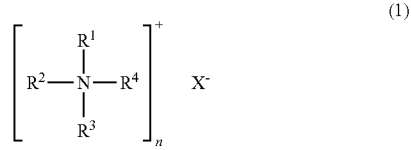

(1)

(where $R^1$, $R^2$, $R^3$, and $R^4$ respectively independently represent organic residue; $X^-$ represents an acid radical; and n represents an integer of from 1 to 3).

As the cation that is composed by the residue described above, there can be taken up as examples $[(CH_3)_3NCH_2CH_2OH]^+$ wherein $R^1$, $R^2$, and $R^3$ are methyl groups; and $R^4$ is an ethanol group and $[(CH_3)_3NCH_2CH_2CH_2OOCCH_3]^+$ wherein $R^1$, $R^2$, and $R^3$ are methyl groups; and $R^4$ is $-CH_2CH_2OOCCH_3$, preferably $[(CH_3)_3NCH_2CH_2OH]^+$.

Further, in the formula above, the $X^-$ is an acid radical. As the acid radicals, there can be taken up as examples halogen-atomic ion such as fluorine ion, chlorine ion, bromine ion, and iodine ion, hydroxide ion, sulfuric acid ion, phosphoric acid ion, nitric acid ion, carbonic acid ion, boric acid ion, tartaric acid ion, citric acid ion, ascorbic acid ion, gluconic acid ion, or the like. Among others, halogen-atomic ion, hydroxide ion, and carbonic acid ion are preferable, and chlorine ion is particularly preferable.

Also, in the formula (1) above, the n represents an integer of from 1 to 3 and, in general, it is the quaternary ammonium compound expressed with n equals to 1. As the quaternary ammonium compound that is expressed by the formula (1), choline compound having $[(CH_3)_3NCH_2CH_2CH_2OH]^+$ wherein $R^1$, $R^2$ and $R^3$ are methyl groups; and $R^4$ is ethanol group is preferable. The reason for this is that the choline cation that is produced by being a dissociated choline compound is easily bonded to the negative-charge region that exists on the surface of the $SiO_2$ film. As the choline compounds like those, concretely, choline halide compounds such as choline chloride ($[(CH_3)_3NCH_2CH_2OH]Cl$), choline iodide ($[(CH_3)_3NCH_2CH_2OH]I$) or choline bromide ($[(CH_3)_3NCH_2CH_2OH]Br$) are preferable in the respect that the polishing selectivity between the $SiO_2$ film and the SOG film becomes high, and particularly choline chloride is preferable in the respect that the choline chloride enables an increase in the polishing selectivity.

As the cationic surfactants, concretely, there can be taken up as examples the ones that follow. They are alkyl-trimethylammonium halide having an alkyl length where the number of carbon atoms is from 6 to 18, such as hexadecyl-trimethyl-ammonium bromide, pyridinium-alkylhalide having an alkyl length where the number of carbon atoms is from 6 to 18, such as cetyl-pyridiniumchloride, and alkyl-ammonium ester having an alkyl length where the number of carbon atoms is from 6 to 18, such as dodecylammonium acetate. They may be used in an independent form or in a form wherein they are combined together as a mixture. Among others, as the cationic surfactant, using dodecyl-trimethyl-ammonium bromide, dodecyl-pyridiniumchloride, tetradecyl-trimethylammoniumchloride, tetradecylpyridinium bromide, hexadecyl-trimethylammoniumchloride, or cetyl-pytidiniumchloride is preferable.

In the cationic surfactant that has been explained above, the alkylic chain in the hydrophobic part thereof may be linear chain or in the state of it's being branched. There is the tendency that the greater the chain length of the hydrophobic part becomes, the more increased the polishing selectivity of the SOG film 4 to the $SiO_2$ film 3 becomes. Therefore, when viewing from the standpoint of the polishing selectivity's increasing, it is preferable to use the cationic surfactant the hydrophobic part of that has a greater chain length and the mass average molecular weight of that is great. Also, when a benzene ring is contained in the hydrophobic part, the selectivity of the polish rate thereof tends to decrease. Therefore, it is preferable to use the surfactant not containing a benzene ring. As the surfactant not containing a benzene ring, there can be taken up as examples cetyltrimethylammonium chloride, lauryltrimethylammonium chloride, cetyltrimethylammonium bromide, cetylpyridinium bromide, dodecylpyridinium chloride, diallyldimethylammonium chloride, and polyethylene imine.

As the polishing particles, cerium oxide is used. The reason why cerium oxide has been selected as the polishing particles is because the cerium oxide has excellent polishing rate and has an excellent value of polishing selectivity between the $SiO_2$ film 3 and the SOG film 4. Namely, that reason is because, as will be explained using FIG. 7, the cerium oxide has an excellent polishing rate for the MSQ film. Also, in addition, that reason is because the polishing selectivity between the TEOS film and MSQ film when cerium oxide and cationic surfactant are concurrently used is much more excellent than that when using other polishing particles. Incidentally, in FIG. 7, there are plotted on the abscissa axis the polishing particles ($Al_2O_3$, $SiO_2$, $TiO_2$, $CeO_2$+surfactant) and there are plotted on the ordinate axis the CMP speed and polishing selectivity. In that figure, as the surfactant, there is used cetyltrimethylammonium chloride.

The particle size of cerium oxide is not particularly limited only if the cerium oxide functions as the polishing particles, preferably is from 10 nm to 100 nm, more preferably from 20 nm to 50 nm in terms of the primary particle size. The terminology "particle size" refers to the average diameter of the particles and, in a case where the particles are not spherical, the average maximum dimension of the particles.

Regarding the polishing particles, it is preferable that they be used in a range wherein the amount of them is 0.1 weight % to 10 weight % of the total slurry. This is because if the amount is below 0.1 weight %, they have the tendency that the polishing rate for the TEOS is too low. If that amount exceeds 10 weight %, they have the tendency that their polishing rate for the TEOS becomes unable to be suppressed. Incidentally, although the effect of CMP is sufficiently obtained by using cerium oxide as the polishing particles, no inconvenience occurs even if making concurrent use of this cerium oxide and other earlier known polishing particles.

It is preferable that the pH value of the slurry used for CMP be adjusted so that the pH value may be 8 at maximum. This is because when the pH value exceeds 8, $Si(OH)_4$ is formed and in consequence there is the tendency that the polishing rate for the $SiO_2$ film becomes unable to be suppressed. Also, when the pH value is below 3, there is the tendency that the polishing rate for the SOG film inconveniently decreases. Therefore, it is more preferable that the pH value of the slurry be adjusted to from 3 inclusive to 8 inclusive it is again more preferable that the pH value of the slurry be adjusted to from 4 inclusive to 7 inclusive. This is because the polishing selectivity increases.

Although adjusting the pH value can certainly be performed also by adding the above-described quaternary ammonium salt, even addition of the pH adjuster also serves the purpose. As the pH adjuster, it is not particularly limited and can be used if the pH adjuster contains either a base or an acid and doesn't cause aggregation of the polish particles. As the bases, concretely, there can be taken up as examples, in addition to the above-described quaternary ammonium salt, potassium hydroxide, ammonium hydroxide, water solution of ammonium, ethanol amine, etc. Above all, water solution of ammonium is preferable in the respect that the use of water solution of ammonium causes the increase in the polishing selectivity. Also, as the acids, concretely, there can be taken up as examples hydrochloric acid, sulfuric acid, phosphoric acid, and nitric acid. Above all, nitric acid is preferable in the respect that the polishing selectivity increases. Incidentally, appropriate bases and acids as well as an appropriate amount thereof will be apparent from the people's who are skilled in the art technical common sense.

Regarding the concentration of the cationic surfactant in the slurry used in the CMP, it is preferable that that concentration be from 0.01 weight % inclusive to 10 weight % inclusive. The reason for this is as follows. If the concentration is below 0.01 weight %, this is insufficient to cause the adsorption of the surfactant to the $SiO_2$ film as well as to thereby protect the $SiO_2$ film and, therefore, it is difficult to suppress the polishing rate for the $SiO_2$ film. On the other hand, if the concentration exceeds 10 weight %, the viscosity of the slurry becomes high, with the result that handling the slurry such as supplying the slurry becomes difficult. The concentration of the cationic surfactant in the slurry provides a higher level of convenience when it is from 0.01 weight % inclusive to 5 weight % inclusive.

When performing CMP while the wafer and polishing pad are relatively moved with the slurry being kept supplied onto the polishing pad, the polishing conditions preferably are set as follows.

The elastic modulus in compression of the polishing pad preferably is set to be from 100 MPa inclusive to 600 MPa inclusive. The reason for this is as follows. If the elastic modulus in compression is below 100 MPa, great elastic deformation thereof occurs to be difficult ensuring that the polishing pad has flatness. If the elastic modulus in compression is over 600 MPa, scratches become easy to form in the substrate.

Preferably, the relative speed of the wafer is set to be from 0.5 m/sec inclusive to 2.5 m/sec inclusive. The reason for this is as follows. In a case where below 0.5/sec, a sufficient value of polishing rate of the SOG cannot be obtained. Also, if over 2.5 m/sec, the wafer has the increased danger of springing out.

The toppling load during the CMP step preferably is from 200 $gf/cm^2$ inclusive to 700 $gf/cm^2$ inclusive. The reason for this is as follows. If below 200 $gf/cm^2$, the sufficient polishing rate for the SOG film is not only obtained, but does also planarization become difficult to perform at the same time. Also, if over 700 $gf/cm^2$, the polishing rate for the $SiO_2$ film cannot be suppressed and, in addition, simultaneously, scratches that are formed become increased.

As the polishing device, it is possible to use a earlierly known polishing device that has a holder for retaining the substrate and a polishing table on which there is mounted the polishing pad.

(Semiconductor Device)

Figure 5:
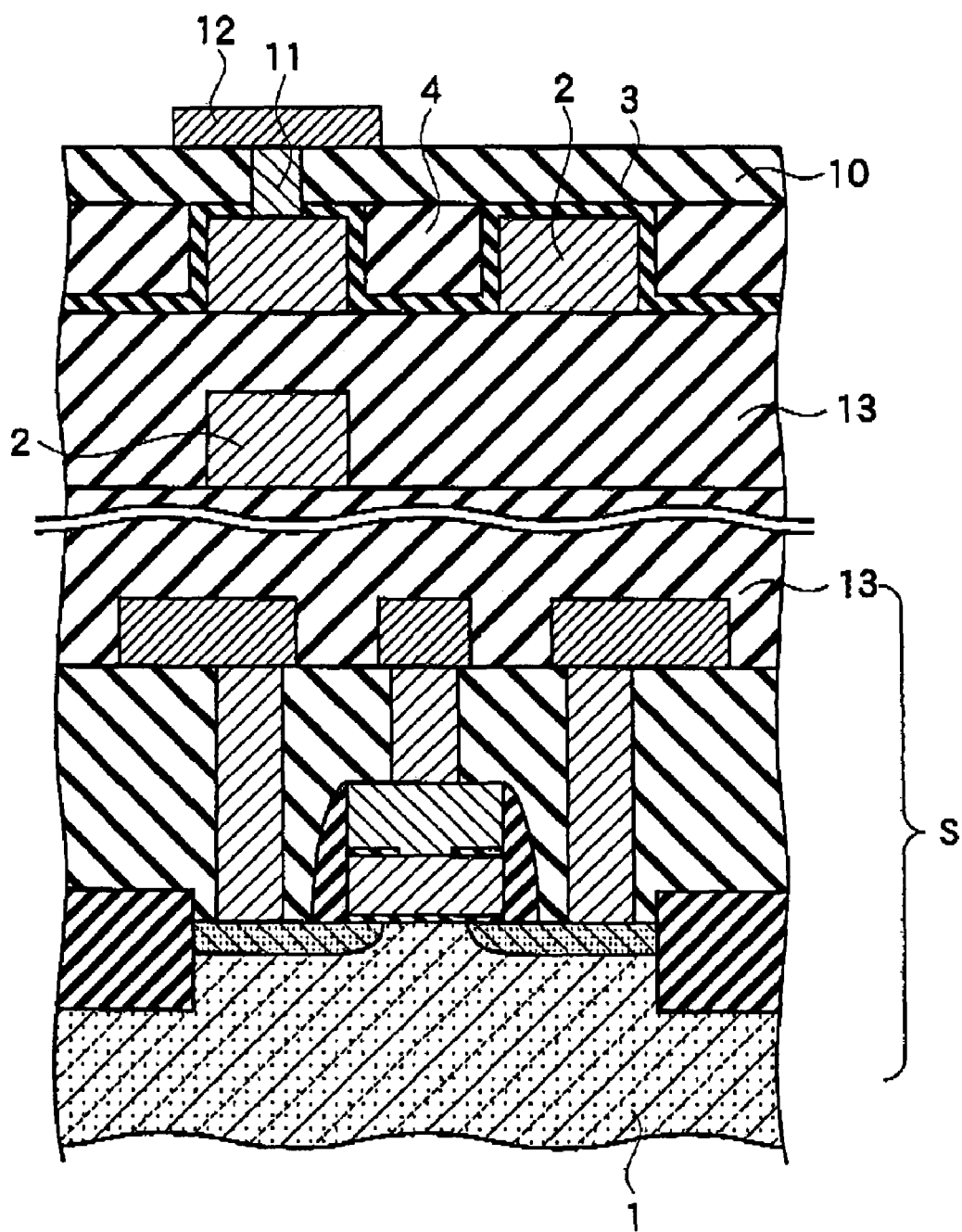
FIG. 5 is a schematic sectional view, partly enlarged, of the first embodiment of a semiconductor device that has a multi-layer wiring structure.

As illustrated in FIG. 5, the semiconductor device encompasses a semiconductor memory S of a stack gate structure that is formed on the substrate 1, an inter level dielectric film 13 that is formed on the memory S and that has a wiring pattern 2 embedded therein, a final wiring layer that is equipped with the wiring pattern 2 that is insulated by the $SiO_2$ film 3 and SOG film 4, and a passivation film 10 that is formed on the final wiring layer and that serves as a protection film, the wiring pattern 2 being connected to an electrode pad 12 via a metal wiring 11 that is formed in a via hole. FIG. 5 shows the peripheral circuit portion of a memory S. As shown in FIG. 5, a transistor in the peripheral circuit portion has the structure, different from that of a memory cell transistor, in which a part of insulation film between a floating gate and a controlling gate is removed, and short-circuited.

The semiconductor device that has the multi-layer wiring structure like that is manufactured by executing the process steps that were explained in the first embodiment after executing the desired wiring process steps and immediately before executing the passivation film forming process step.

While as the SOG film 4 that is the inter level dielectric film the MSQ film is widely used, the MSQ film has the property of absorbing water. For this reason, when after having placed the MSQ film on the wiring pattern 2 the passivation film 10 is formed on the final layer, it is seriously thought that the MSQ film absorbs water through the passivation film 10 to cause the corrosion of the wiring pattern 2. On that account, from the standpoint of preventing the corrosion of the wiring pattern 2 from occurring, on the uppermost wiring pattern 2 the closest to the passivation film 10 there is formed as an insulation film that doesn't exhibit water-absorbing property the $SiO_2$ film 3.

According to the manufacturing method of the first embodiment of the present invention, for example, in the case where the TEOS film is used as $SiO_2$ film and the MSQ film is used as SOG film, the TEOS film and MSQ film can be polished with the value of 5 or more, preferably 10 or more, of polishing selectivity. For that reason, the MSQ film could be polished without neither leaving the MSQ film on the TEOS film nor damaging the TEOS film.

In the way that has been described above, according to the manufacturing method of the first embodiment of the present invention, by having provided the process step in which polishing and planarization are performed, using the slurry containing cerium and at least one kind of cationic surfactant, through the performance of the CMP process, the $SiO_2$ film and SOG film can be polished with an excellent value of polishing selectivity. Namely, for the reason why the polishing selectivity is increased, the reliability on the semiconductor device can be enhanced through the enhancement of the insulating capability of the semiconductor device. Therefore, according to the method of manufacturing a semiconductor device according to the first embodiment of the present invention, it is possible to manufacture a semiconductor device from which a very high level of reliability is demanded, such as a memory, a high-speed logic LSI, a system LSI, or a memory/logic mixed LSI.

Second Embodiment

In a case where the thickness of the $SiO_2$ film 3 is 150 nm or less, with the polishing method according to the above-described first embodiment, difficulty is encountered in well leaving the $SiO_2$ film 3 as it is after the performance of the CMP. Especially, in a case where the wiring pattern is provided isolatedly, it is difficult to make the $SiO_2$ film 3 be left as it is.

Figure 14A:
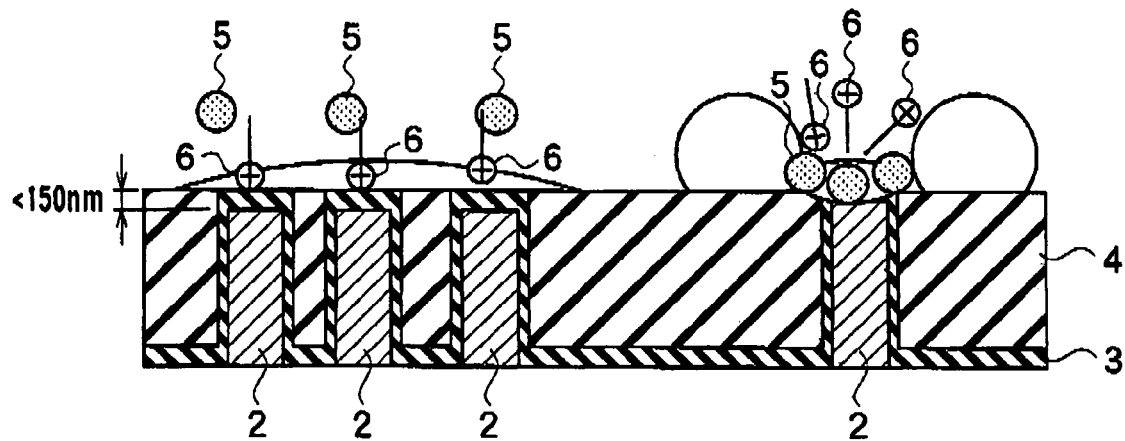
FIGS. 14A and 14B are conceptual views illustrating the method of manufacturing a semiconductor device according to a second embodiment.
Figure 14B:
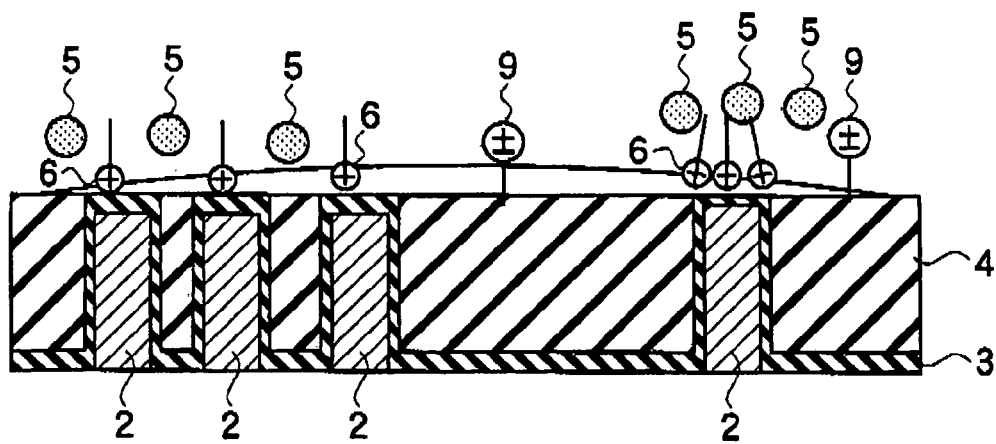

This can be explained as follows using FIGS. 14A and 14B. Since the $SiO_2$ film 3 that has been disposed on the wiring pattern 2 is hydrophilic, in the portion where the wiring pattern 2 is densely disposed, the surfactant 6 becomes spread on the $SiO_2$ film 3 while wetting by it is being done. And, by the cationic surfactant's being adsorbed to the $SiO_2$ film 3, the $SiO_2$ film 3 is prevented from being polished. On the other hand, in the portion where the wiring pattern 2 is disposed isolatedly, the surfactant 6 becomes, due to the effect of the SOG film 4 that has hydrophobicity, unable to be well spread while wetting by it is done. Therefore, the surfactant 6, comes to have the difficulty of being adsorbed to the $SiO_2$ film 3, failing to protect the $SiO_2$ film 3 and hence it is thought that the $SiO_2$ film 3 is polished. Further, for the reason that has been described above, the $SiO_2$ film 3 on the isolated pattern is easy to eliminate. Namely, even when the thickness of the $SiO_2$ film 3 is 200 nm or more, the process margin with respect to overpolish is narrow.

In this case, by adding a second surfactant that defines a contact angle of less than 60 degrees with respect to the SOG film 4, the wetting capability of the surfactant becomes enhanced. Namely, as illustrated in FIG. 14B, by using the nonionic surfactant 9 as the second surfactant that a contact angle becomes less than 60 degrees with the cationic surfactant 6, the wetted cationic surfactant 6 will more sufficiently spread and be more easily absorbed to the SiO2 film 3 on the isolated pattern rather than using the nonionic surfactant 9 or cationic surfactant 6 independently. Since as a result of this the $SiO_2$ film 3 is effectively protected from cerium oxide 5 that is polishing particle, even after the performance of CMP the $SiO_2$ film 3 becomes able to be left as is.

The angle of contact of the second surfactant with respect to the SOG film 4 is preferably less than 60 degrees, more preferably not more than 50 degrees. If the contact angle is 60 degrees or more, the cationic surfactant 6 comes to have difficulty of being adsorbed to the SOG film 4, failing to protect the $SiO_2$ film 3.

As the example of surfactant, it is possible to use the cationic surfactant (produced by Kao Corporation and available under the trade name of "KD-84") comprised of oligomer where the mass average molecular weight of the hydrophobic part thereof is 500 and a material prepared by further adding acetylenediol-based nonionic surfactant where the value of inter-hydrophilic-hydrophobic balance (HLB) is 13. As the second surfactant, it is possible to adopt, other than the above-described acetylenediol-based surfactant, a surfactant such as silicone-based surfactant, the hydrophobic part of which has high hydrophobicity and which is capable of making the SOG film hydrophilic. The concentration of the second surfactant in the slurry is preferably from 0.01 weight % inclusive to 10 weight % inclusive. The reason for this is as follows. When below 0.01 weight %, the amount of surfactant added is insufficient and this results in failure to make the SOG film hydrophilic. When over 10 weight %, the amount thereof adsorbed to the SOG film is excessively large and this causes a remarkable decrease in the polishing rate. The polishing conditions are the same as in the above described first embodiment.

Third Embodiment (Deposition Step)

Figure 6A:
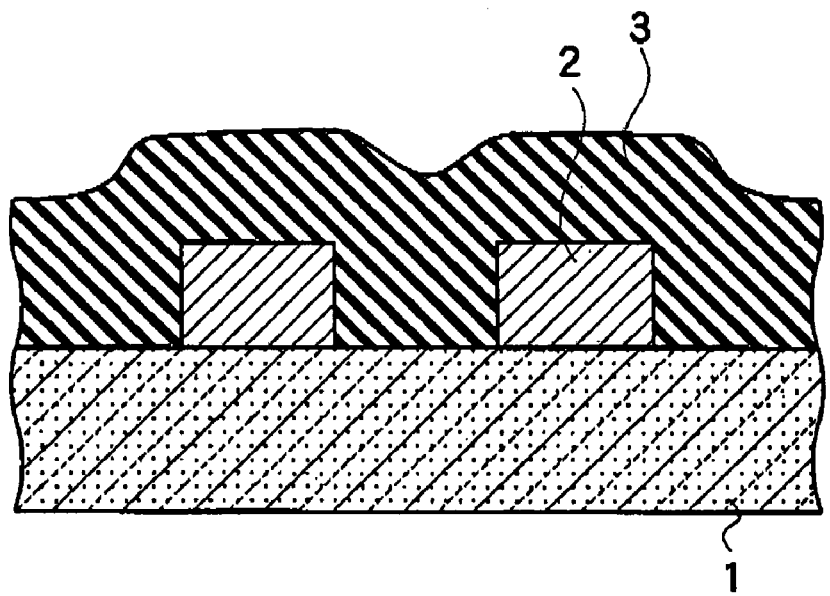
FIGS. 6A and 6B are schematic sectional views illustrating the process steps of the method of manufacturing a semiconductor device according to a third embodiment of the present invention.

First, as illustrated in FIG. 6A, on the substrate 1 having formed thereon the wiring pattern 2, there is deposited the $SiO_2$ film 3.

As the $SiO_2$ film 3, a film such as that which was explained in the first embodiment can be used. However, from the standpoint of excellent step coverage, for example the TEOS film can be used. Also, as the deposition method, there can be taken up as an example the CVD process that was explained in the first embodiment.

(Polishing Step)

Figure 6B:
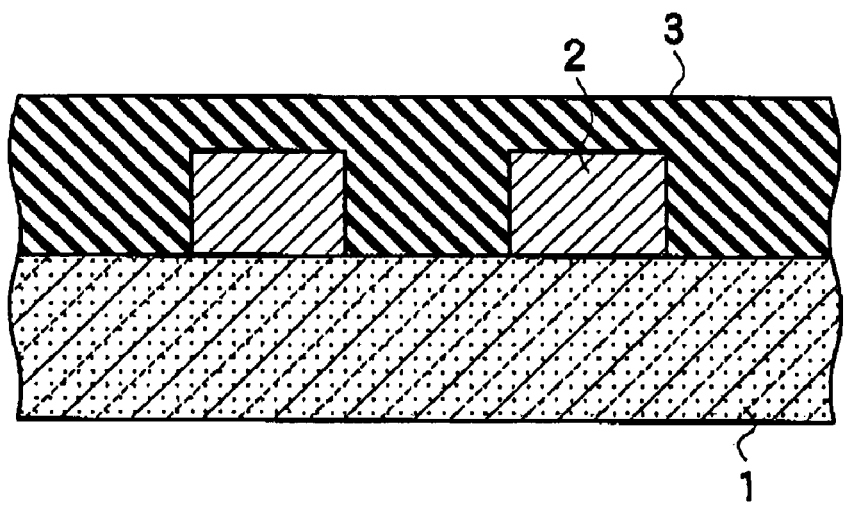

Next, as illustrated in FIG. 6B, using a slurry containing cerium oxide and the cationic surfactant that is oligomer or polymer and the hydrophobic part of that has a mass average molecular weight of 500 or more, the concave-convex part of the $SiO_2$ film 3 is polished with the chemical-mechanical polishing process.

By performing CMP with the use of the slurry containing cerium oxide and prescribed cationic surfactant, the remaining of the polishing particles on the surface of the insulation film is suppressed. The principle that is relevant thereto, as was explained in the first embodiment of the present invention, is thought attributable to the film's of the cationic surfactant being formed on the insulation film. Namely, as illustrated in FIG. 4C, by polishing with the chemical-mechanical polishing process with the use of the slurry containing the cerium oxide 5 and cationic surfactant 6, there are obtained the function and effect that the $SiO_2$ film 3 can be polished while the remaining of the polishing particles on the surface of the $SiO_2$ film is suppressed. The reason why cerium oxide has been selected as the polishing particles is that the $SiO_2$ film 3 can be polished without leaving behind the polishing particles while the polishing rate that is commercially demanded is maintained.

The reason why having selected the cationic surfactant that is oligomer or polymer as the surfactant is that, as explained later using FIG. 8, even in a case where the concentration of that surfactant is low, a moderate high value of CMP speed for the TEOS film is obtained. Also, the reason why having restricted the mass average molecular weight of the hydrophobic part of the surfactant to 500 or more is that if that molecular weight is in the above-described range, as explained later using FIG. 13, it is easy to control the polishing rate for the TEOS film that is used as the $SiO_2$ film.

Regarding the polishing conditions, polishing can be performed under the same conditions as those that were explained in the above-described first embodiment.

By the way, when, in the planarization step of the $SiO_2$ film, CMP is performed using the earlier slurry containing cerium oxide and anionic surfactant, there was the problem that the polishing particles were likely to remain on the surface of the insulation film. The reason for this is thought to be that, because the potential (negative) of the $SiO_2$ film that is a film to be polished and the potential (positive) of the cerium oxide are opposite in polarity, the both have the easiness with which they are adsorbed together. In contrast to this, in the third embodiment, by using, in place of the earlier anionic surfactant and nonionic surfactant, the cationic surfactant, the surfactant becomes adsorbed to the $SiO_2$ film or a micelle is further formed on the resulting film. For this reason, the surface of the $SiO_2$ film becomes positively charged and, therefore, it becomes possible to prevent cerium oxide from remaining on the substrate. Namely, according to the manufacturing method according to the third embodiment of the present invention polishing of the insulation film can be performed without having the polishing particles remarkably left as is on the surface of the insulation film.

Although the example of the present invention is concretely shown, the invention is not limited to the following examples.

Example 1

The sample substrate was prepared as follows. On the elements formed on the substrate there were formed at pitches of 350 nm via an insulation film by the use of a dry etching process aluminium wiring the width of that is 350 nm and the thickness of that is 830 nm. Thereafter, as the protection/adhesion layer that is located on the surface of the aluminium wiring, using the plasma CVD process, there was formed a P-TEOS film the thickness of that was 150 nm. On the TEOS film that had been obtained, as a MSQ-based material, there was coated to a thickness of 940 nm with the use of a spin coating technique a material of LKD 27 that is produced by JSR Company and the trade name of that is LKD. Thereafter, the resulting mass was cured at 400° C. for 20 minutes to thereby form the MSQ film.

Thereafter, by CMP, planarization of the coating film was performed. This CMP, using as the CMP device the CMP device that is produced by Ebara Corporation under the trade name of EPO-222, was performed under the conditions of that the load was 500 gf/cm$^2$; the back-side pressure was 450 gf/cm$^2$; the number of rotations of the top ring was 107 rpm; the number of rotations of the table was 100 rpm; and the polishing length of time was 80 seconds. Namely, the relative speed of the wafer with respect to the polishing pad was 1.9 m/sec. As the polishing pad, the polishing pad that is produced by Rodel Company under the trade name of IC1000 was used as a hard polishing pad the elastic modulus in compression of that was in the range of from 100 MPa to 600 MPa.

As the slurry, there was used a slurry that was prepared in the way that as the polishing particles the cerium oxide particles (produced by JSR Company under the trade name of "CMS4301") that were produced with the fumed process and the primary particle diameter of that was 35 nm and the secondary particle diameter of that was 250 nm were blended into pure water serving as the solvent so as to have a concentration of 0.45 weight % of the slurry; and as the cationic surfactant there was used the cationic surfactant wherein the cetyltrimethylammonium chloride that was quaternary ammonium salt and the hydrophobic part of that had a mass average molecular weight of 150 was blended with a concentration of 3 weight % of the slurry. The pH value of the slurry was 6.6.

When the surface of the substrate that was obtained was observed using a scanning type electronic microscope (SEM), it was proved that the MSQ film had been able to be polished without scratching the TEOS film.

Comparative Example 1

Excepting that as the anionic surfactant there was used a slurry that had been prepared by adding polyacrylic acid approximately 3 weight %, CMP was performed in the same way as in Example 1. Then, the surface of the substrate was observed.

As a result, it was confirmed that the TEOS film had been eliminated and the aluminium wiring had been exposed to the surface of the resulting mass.

Here, regarding the CMP speed for the MSQ film, a value of approximately 70 nm min is obtained, and planarization can be finished in 100 seconds or so, whereas, regarding the CMP speed for the TEOS film is to an extent of 20 to 30 nm/min. Therefore, it is thought that the aluminium wiring was exposed to the surface due to the fact that it was impossible to sufficiently suppress the polishing rate. Incidentally, when over-polish was performed for 30 seconds or so, it was proved that the TEOS film had further been eliminated and the aluminium wiring had further been exposed to the surface.

As described above, from the experimental results of Example 1 and Comparative Example 1, it was confirmed that, according to the method of Example 1, the polishing selectivity was enhanced and, finally, the enhancement in the yield of the semiconductor device, the enhancement in the reliability, and the enhancement of other electrical characteristics could be achieved.

Example 2

Experiments were conducted under the same conditions as in Example 1 excepting that as the cationic surfactant there was used the cationic surfactant (produced by Kao Corporation under the trade name of "KD-84") the hydrophobic part of that is comprised of oligomer and has a mass average molecular weight of 500.

As a result of performing CMP under the same conditions as in Example 1, it was possible to suppress the polishing rate for the TEOS film to not more than 3 nm/min while maintaining the polishing rate for the coating film as it is. As a result of performing CMP with respect to the MSQ film, the MSQ film could be completely eliminated in 80 seconds. Furthermore, the margin with respect to the over-polish was also sufficient.

From the results stated above, in a case where using the surfactant the hydrophobic part of that has a gigantic molecular weight, especially the surfactant the hydrophobic part of that has a mass average molecular weight of 500 or more, it was proved that the polishing selectivity was further increased, so that the effect of suppressing the polishing rate for the TEOS film becomes great.

Also, it was proved that, even among the surfactants the hydrophobic part of that is comprised of oligomer or polymer, the greater the number of hydrophilic groups was, the more excellent the selectivity of polish was. This is because, with the number of hydrophilic groups being small in number, in a case where the MSQ film and TEOS film co-exist, it is thought that it becomes substantially difficult to protect the TEOS film due to the surfactant's being bonded to the MSQ film in terms of the hydrophobic group.

Example 3

CMP was conducted under the following conditions to evaluate the effects of the polishing particles and surfactant upon the CMP speed and polishing selectivity.

On the elements formed on the substrate, there were formed at pitches of 350 nm via an insulation film by the use of the dry etching process aluminium wiring the width of that is 350 nm and the thickness of that is 830 nm. Thereafter, as the protection/adhesion layer that is located on the surface of the aluminium wiring, using the plasma CVD process, there was formed a P-TEOS film the thickness of that was 150 nm. On the TEOS film that had been obtained, as a MSQ-based material, there was coated to a thickness of 940 nm with the use of the spin coating technique a material of LKD 27 that is produced by JSR Company and the trade name of that is LKD. Thereafter, the resulting mass was cured at 400° C. for 20 minutes to thereby form the MSQ film.

Thereafter, by CMP, planarization of the coating film was performed. This CMP, using as the CMP device the CMP device that is produced by Ebara Corporation under the trade name of EPO-222, was performed under the conditions of that the load was 500 gf/cm$^2$; the back-side pressure was 450 gf/cm$^2$; the number of rotations of the top ring was 107 rpm; the number of rotations of the table was 100 rpm; and the polishing length of time was 80 seconds. Namely, the relative speed of the wafer with respect to the polishing pad was 1.9 m/sec. As the polishing pad, the polishing pad that is produced by Rodel Company under the trade name of IC1000 was used as a hard polishing pad the elastic modulus in compression of that was in the range of from 100 MPa to 600 MPa.

Figure 7:
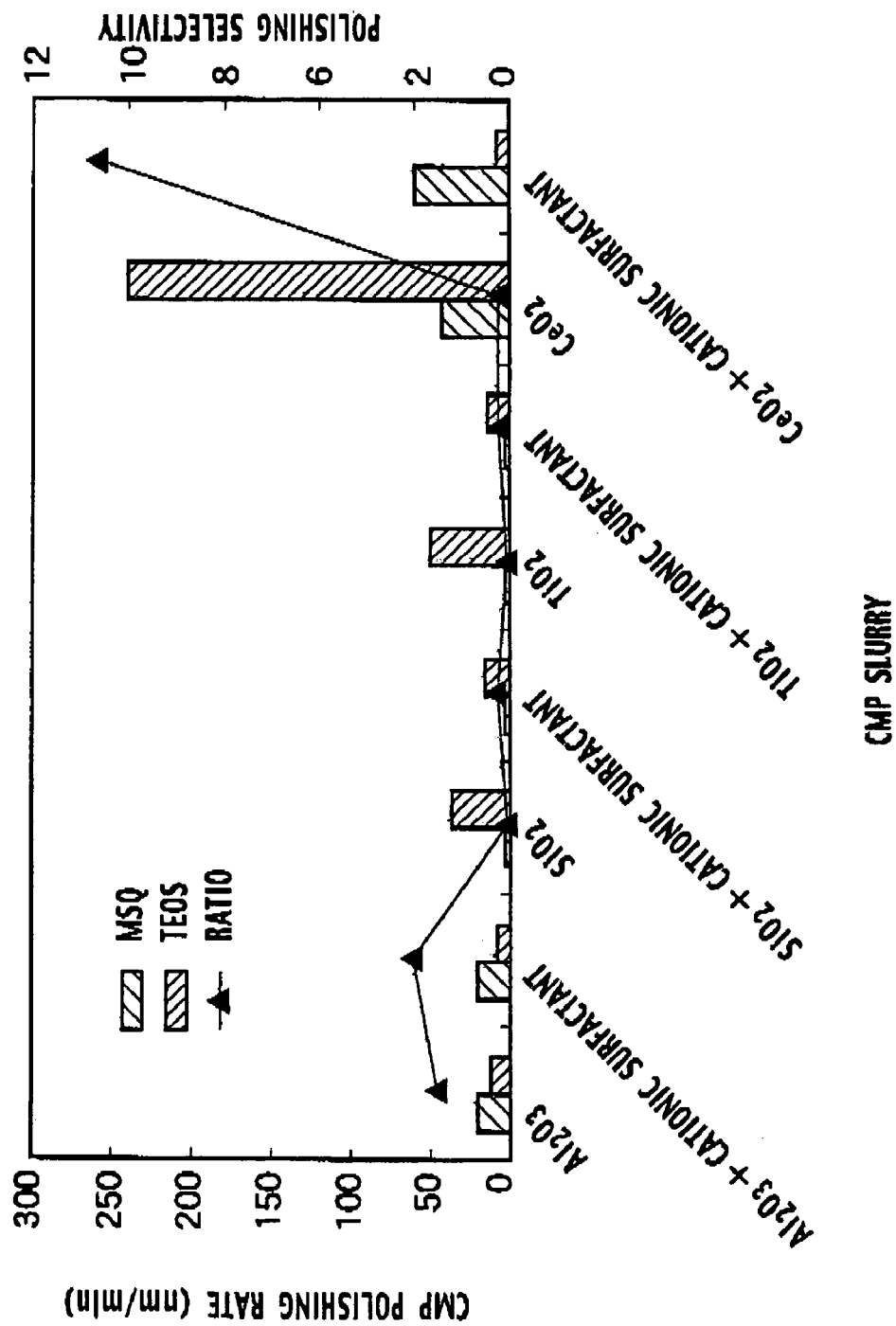
FIG. 7 is a graphic diagram illustrating the CMP polishing rate for each of a tetraethoxysilane (TEOS) film and methyl silsesquioxane (MSQ) film and the polishing selectivity between these two films when using only polishing particles alone or making concurrent use of polishing particles and surfactant.

As the slurry, as illustrated in FIG. 7, there was used a slurry that was prepared in the way that only the polishing particles were blended into pure water serving as the solvent, as well as a slurry that was prepared in the way that into that slurry there was further blended the surfactant. When preparing the slurry, the polishing particles were prepared so that they may have a concentration of 0.45 weight % of the slurry. Also, as the Al$_2$O$_3$ particles, there were used alumina particles, which had a primary particle diameter of 50 nm and were produced with the fumed process.

As the SiO$_2$ particles, there were used colloidal silica particles the primary particle diameter of that was 35 nm. As the TiO$_2$ particles, there were used titania particles that were produced with the fumed process and the primary particle diameter was 20 nm. As the CeO$_2$ particles, there were used cerium oxide particles (produced by JSR Company under the trade name of "CMS4301") that were produced with the fumed process and the primary particle diameter and secondary particle diameter of that were 35 nm and 250 nm, respectively.

Also, as the cationic surfactant, the cetyltrimethylammonium chloride that is quaternary ammonium salt and the hydrophobic part of that has a mass average molecular weight of 150 was blended at a concentration of 3 weight % of the slurry. The pH values of the slurries were respectively 6.6. The results obtained are shown in FIG. 7.

From FIG. 7, it was proved that by performing CMP using cerium oxide and cationic surfactant, the MSQ film could be polished at a polishing rate of 50 nm/min or more; and, also, polishing could be done with an excellent value of polishing selectivity. On the other hand, while it is commercially demanded that when polishing the MSQ film, polishing be done at a polishing rate of 50 nm/min or more, other than the polishing agents referred to above failed to satisfy this demand as far as a relevant system of polishing agents is concerned.

Example 4

CMP was conducted under the following conditions to evaluate the effects of the surfactant and the concentration thereof upon the CMP speed for the TEOS film. On the elements formed on the substrate there were formed at pitches of 350 nm via an insulation film by the use of the dry etching process aluminium wiring the width of that is 350 nm and the thickness of that is 830 nm. Thereafter, as the protection/adhesion layer that is located on the surface of the aluminium wiring, using the plasma CVD process, there was formed a TEOS film the thickness of that was 150 nm.

Thereafter, by CMP, planarization of the TEOS film was performed. This CMP, using as the CMP device the material that is produced by Ebara Corporation under the trade name of EPO-222, was performed under the conditions of that the load was 500 gf/cm$^2$; the back-side pressure was 450 gf/cm$^2$; the number of rotations of the top ring was 107 rpm; the number of rotations of the table was 100 rpm; and the polishing length of time was 80 seconds. Namely, the relative speed of the wafer with respect to the polishing pad was 1.9 m/sec. As the polishing pad, the material that is produced by Rodel Company under the trade name of IC1000 was used as a hard quality of polishing pad the elastic modulus in compression of that was in the range of from 100 MPa to 600 MPa.

Figure 8:
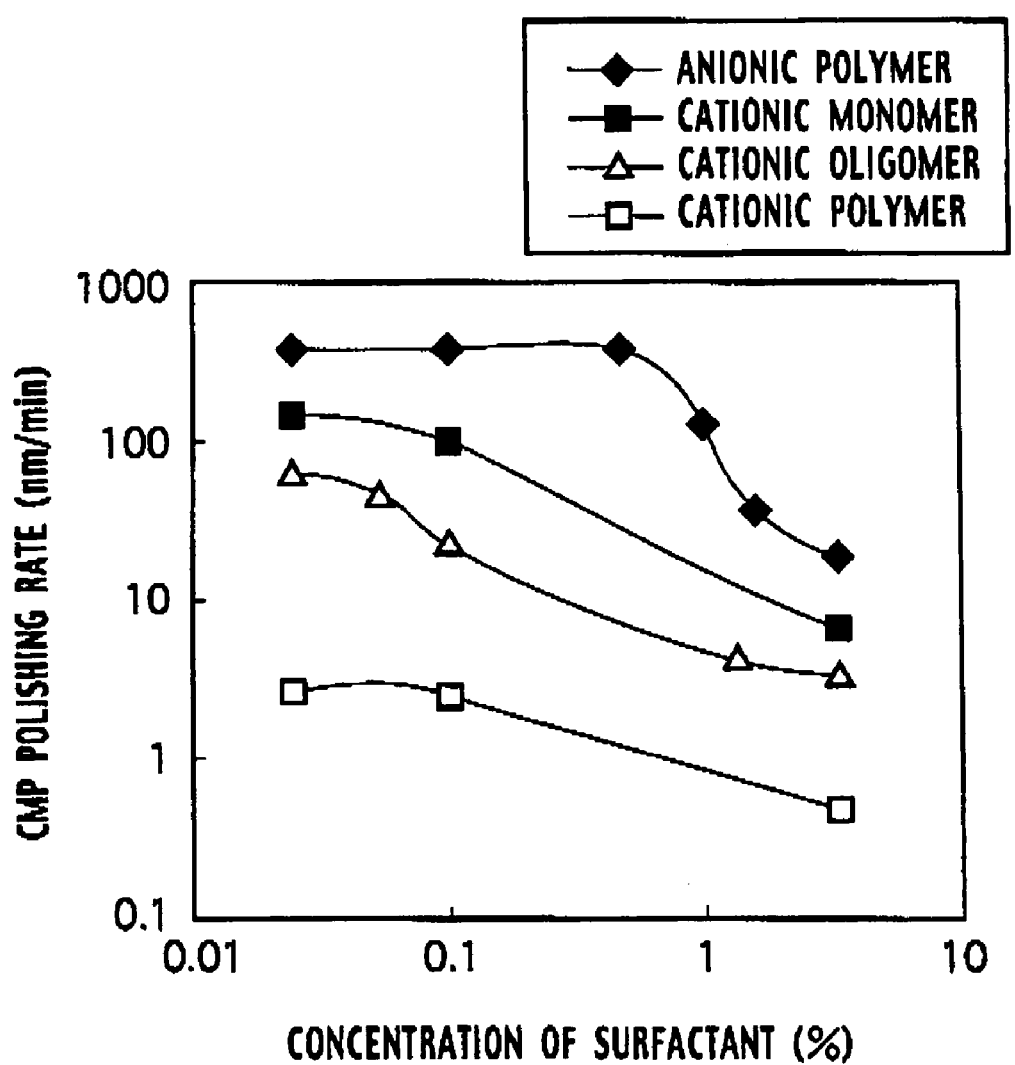
FIG. 8 is a graphic diagram illustrating the polishing rate when having performed CMP with respect to the TEOS film by using as the surfactant anionic polymer, cationic monomer, cationic oligomer, or cationic polymer.

As the slurry, there was used the material that was prepared in the way that the cerium oxide particles (produced by JSR Company under the trade name of "CMS4301"), which had been produced with the fumed process and had a primary particle diameter of 35 nm and a secondary particle diameter of 250 nm, were blended so as to have a concentration of 0.45 weight % of the slurry; and, further, as the surfactant there were used materials that were prepared by blending the anionic polymer (0.025 weight %, 0.1 weight %, 0.5 weight %, 1.0 weight %, 1.5 weight %, and 3.0 weight %) shown in FIG. 8, the cationic monomer (0.025 weight %, 0.1 weight %, and 3.0 weight %) similarly shown, the cationic oligomer (0.025 weight %, 0.05 weight %, 0.1 weight %, 1.0 weight %, and 3.0 weight %) similarly shown, and the cationic polymer (0.025 weight %, 0.1 weight %, and 3.0 weight %) similarly shown, each, so that the weight % thereof based upon the total mass of slurry may have the above-described bracketed concentration. The results obtained are shown in FIG. 8.

From FIG. 8, it was proved that when performing CMP using as the surfactant the cationic oligomer or cationic polymer, the polishing rate for the TEOS film was suppressed.

Namely, in a case where polishing is performed using the earlier slurry containing the anionic surfactant or the cationic surfactant the hydrophobic part of which has the structure of monomer, when the slurry is low in concentration, it was proved that the effect of suppressing the polishing rate for the TEOS film was small and it was necessary that the surfactant should have been added so as to have a concentration of at least 3 weight %. Also, it was proved that, in a case where CMP is performed using the slurry containing the surfactant the hydrophobic part of which consists of oligomer or polymer, even when the concentration is below 1 weight %, it was possible to suppress down to a polishing rate of not more than 10 nm/min.

Also, the surface of each of the substrates obtained was observed using a scanning type electronic microscope (SEM). As a result, it was proved that whereas no polishing particles remained on the TEOS film of the substrate with respect to which CMP had been performed using the cationic oligomer or cationic polymer, polishing particles remained on the TEOS film of the other substrate portions.

Generally, when performing CMP with respect to the TEOS film, to obtain a high level of planarity, it has hitherto been desired to minimize the TEOS polishing rate (namely, the TEOS polishing rate at the concave portion) under the pressure that is being applied. Further, when the surfactant becomes increased in concentration, the viscosity of the slurry becomes high, with the result that the controllability and the stability for keeping in custody become deteriorated. Therefore, it is desired that the concentration of the surfactant be minimized. Also, it is desired that no polishing particles remain on the surface of the TEOS film. The above-described Example 4 that satisfies those demands has surely been epoch-making.

Reference Example 1

Figure 9:
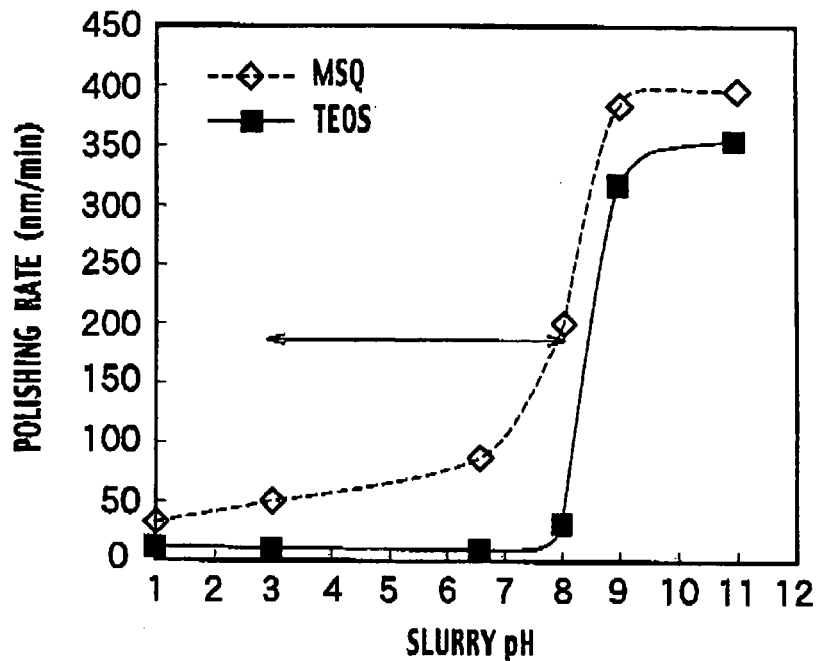
FIG. 9 is a graphic diagram illustrating the dependency upon the pH of a slurry of the polishing rates for the MSQ film and TEOS film and the polishing selectivity between these two films.

In order to evaluate the effects of the pH values of the slurry upon the polishing rate for the MSQ film and TEOS film, CMP was performed under the same conditions as in Example 1 excepting that the pH of the slurry were set as under the conditions illustrated in FIG. 9. At that time, for adjusting the pH values, nitric acid was used as acid and water solution of ammonium was used as alkali. The results obtained are shown in FIG. 9.

From FIG. 9, it was proved that, when the pH values of the slurry were in the range of from 3 inclusive to 8 inclusive that is indicated by the arrow in the figure, an excellent, selectivity of polish in particular was obtained.

Reference Example 2

Figure 10:
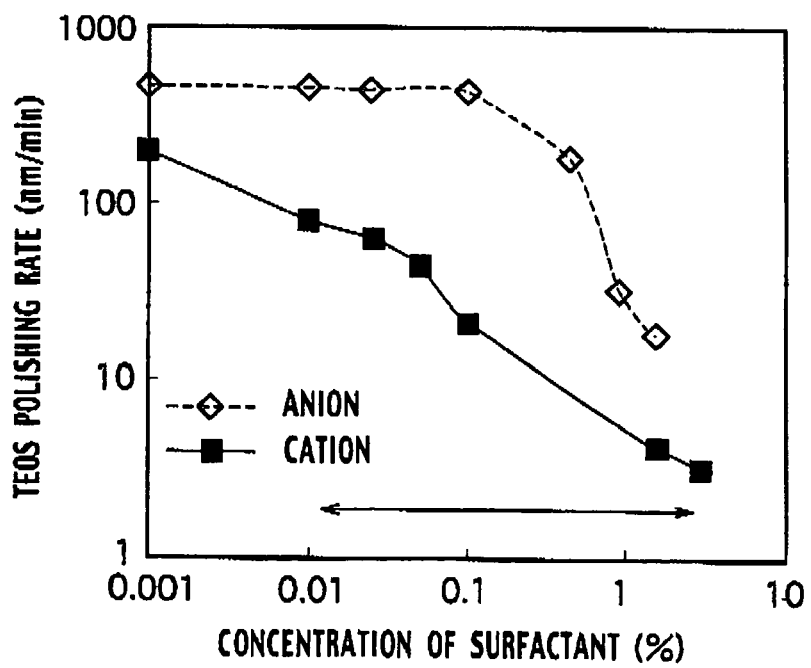
FIG. 10 is a graphic diagram illustrating the dependency upon the surfactant concentration of the polishing rate for the TEOS film.

In order to evaluate the effect of the concentration of the surfactant upon the polishing rate for the TEOS, CMP was performed under the same conditions as in Example 1 excepting that the concentration of the surfactant was set as under the conditions illustrated in FIG. 10.

Also, in order to evaluate the effects upon the polishing rate for the TEOS film that are brought about when using the anionic surfactant and cationic surfactant, CMP was performed under the same conditions as in Comparative Example 1 excepting that the anionic surfactant was used under the conditions illustrated in FIG. 10. The results obtained are collectively shown in FIG. 10.

From FIG. 10, it was proved that, in the earlier technique that uses the anionic surfactant as the surfactant, the added concentration of 1 weight % or more was necessary for suppressing the polishing rate for the TEOS film. In contrast to this, in a case where using the cationic surfactant, it was proved that, since in that case the electrical interaction was strong, the very small adding amount of 0.01 weight % enabled suppressing the polishing rate for the TEOS film. As a result of this, it was proved that, by setting the concentration of the cationic surfactant in the slurry to within the range of from 0.01 weight % to 5 weight % that is indicated by the arrow in FIG. 10, the enhancement in the selectivity of polish and economical enhancement, in particular, could be achieved.

Example 3

Figure 11:
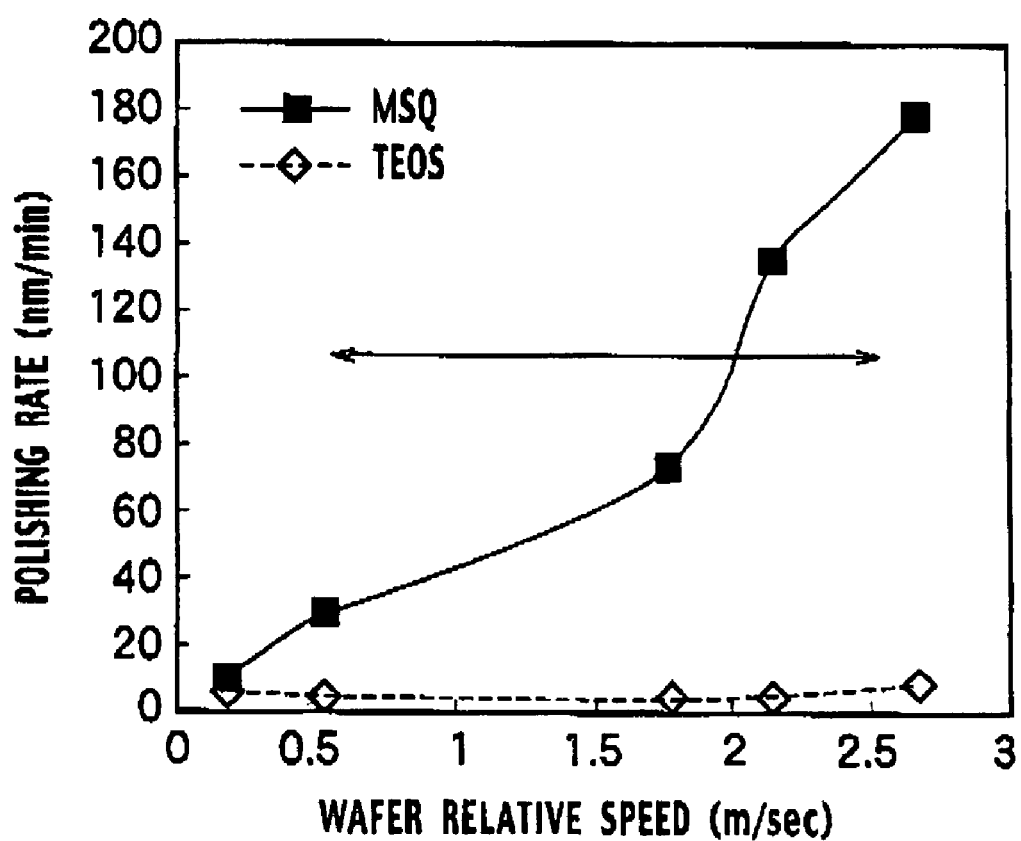
FIG. 11 is a graphic diagram the dependency upon the wafer speed of the polishing rates for MSQ film and TEOS film.

To evaluate the effects of the relative speed of the wafer upon the polishing rate for the MSQ film and TEOS film, CMP was performed under the same conditions as in Example 1 excepting that the relative speed of the wafer was set as under the conditions shown in FIG. 11. The results obtained are shown in FIG. 11.

From FIG. 11, it was proved that by setting the relative speed of the wafer to within the range of from 0.5 m/sec inclusive to 2.5 m/sec inclusive that is indicated by the arrow in the figure, the selectivity of polish for the TEOS film and MSQ film became very high.

Reference Example 4

Figure 12:
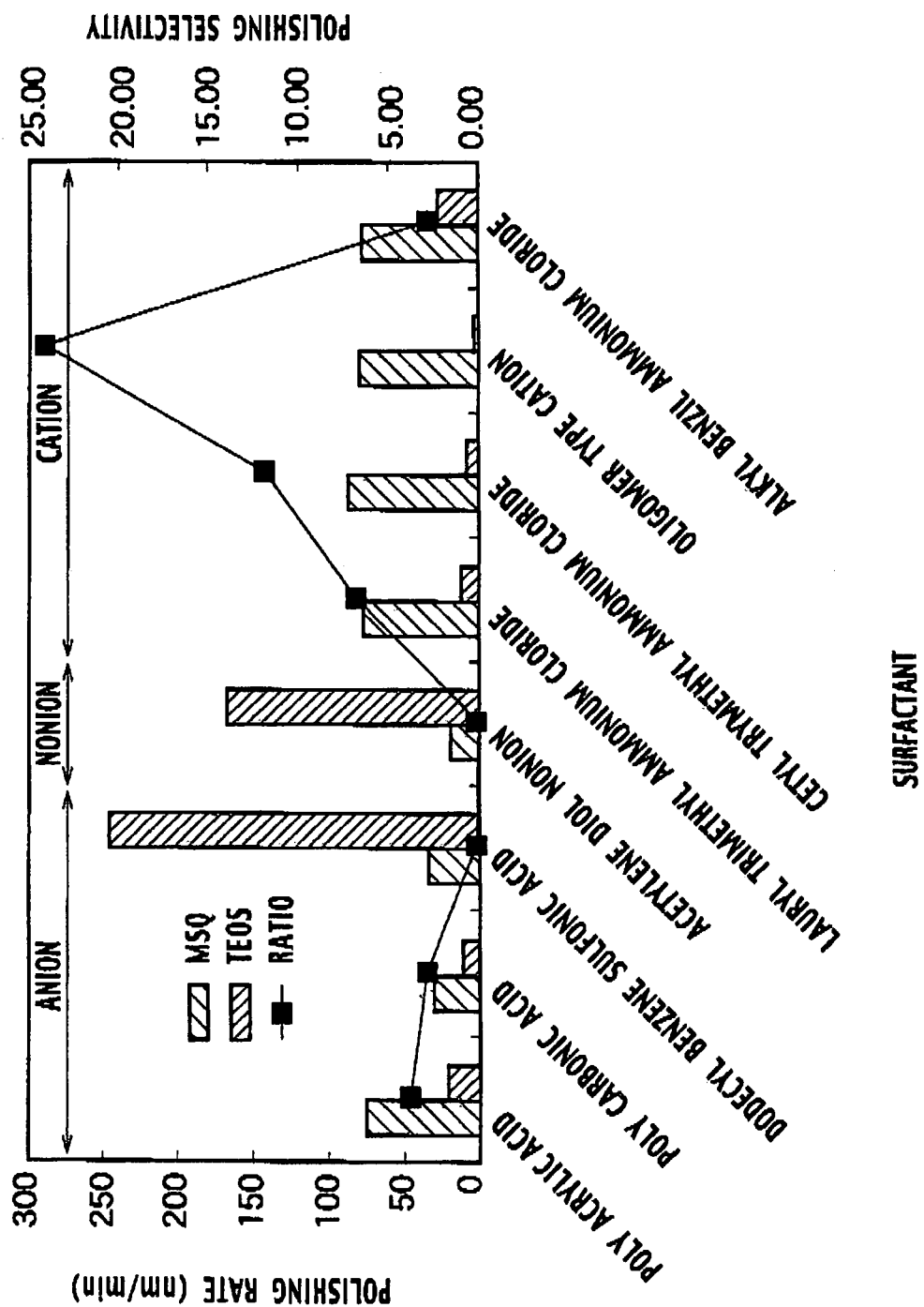
FIG. 12 is a graphic diagram illustrating the dependency upon the surfactant of the polishing rates for MSQ film and TEOS film and the polishing selectivity between these two films.

To evaluate the effects of the surfactant upon the polishing rate and selectivity of polish for the TEOS film and MSQ film, CMP was performed under the same conditions as in Example excepting that as the surfactants there were used the materials illustrated in FIG. 12. The results obtained are shown in FIG. 12.

From FIG. 12, it was proved that, compared to the earlier technique using the anionic surfactant or nonionic surfactant as the surfactant, in a case where using the cationic surfactant, polishing of the TEOS film and MSO film could be done with an excellent polishing selectivity. In addition, when using the cationic surfactant having a benzene ring at its hydrophobic part, for example, alkylbenzylammonium chloride, it was proved that the effect of suppressing the polishing rate for the TEOS film became small.

Reference Example 5

Figure 13:
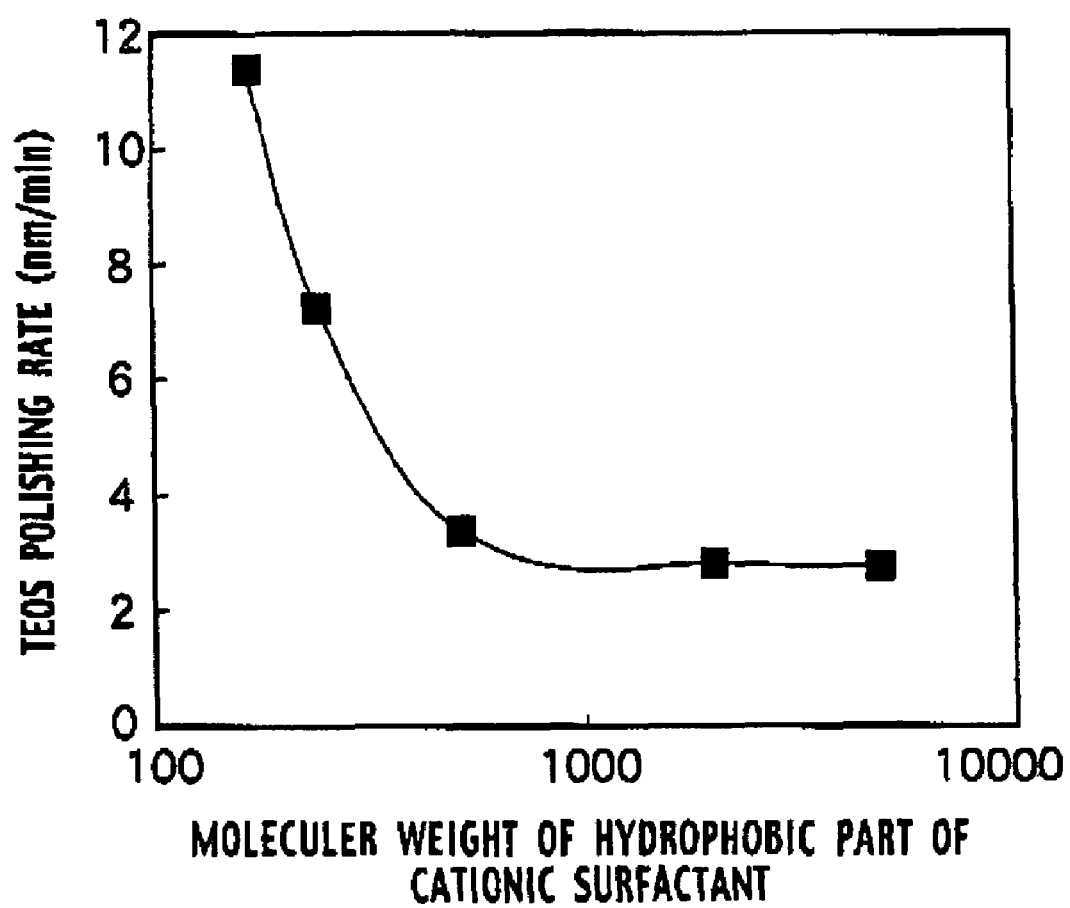
FIG. 13 is a graphic diagram illustrating the dependency of the polishing rate for the TEOS film upon the hydrophobic part molecular weight of cationic surfactant.

To evaluate the effects of the molecular weight in the hydrophobic part of the cationic surfactant upon the polishing rate for the TEOS film, CMP was performed under the same conditions as in Example 2 excepting that the molecular weight in the hydrophobic part of the cationic surfactant was set as under the conditions illustrated in FIG. 13. The obtained results are shown in FIG. 13. Incidentally, the molecular weight in the hydrophobic part in FIG. 13 is mass average molecular weight.

From FIG. 13, in a case where using the cationic surfactant, it was proved that the greater the chain length of the hydrophobic part was, the more greatly enhanced the polishing selectivity became. It was confirmed that, when the mass average molecular weight of the hydrophobic part was 500 or more, preferably 1000 or more, the polishing rate for the TEOS film was remarkably suppressed. Also, it was confirmed that the hydrophobic part of the cationic surfactant preferably was a material the chemical structure of that was shaped like a chain and the molecular weight of that was high. It was also confirmed that that material was the material the chemical structure was constructed of, especially, an alkyl group.

Reference Example 6

To evaluate the effects upon the polishing rate for the SOG film that are brought about when the thickness of the $SiO_2$ film covering the Al wiring is small (<150 nm), experiments were conducted. Concretely, in respective cases where the cationic surfactant and nonionic surfactant were concurrently used and where only the cationic surfactant alone was used, there were measured the TEOS residual film thickness/initial film thickness when overpolishing was performed.

Here, as the cationic surfactant there was used the cationic surfactant (produced by the Kao Corporation under the trade name of "KD-84") comprised of oligomer the hydrophobic part of which had a mass average molecular weight of 500, the concentration was 3 weight %. Also, as the nonionic surfactant, there was used acetylenediol-based nonionic surfactant the value of inter-hydrophilic-hydrophobic balance (HLB) of which was 13, the contact angle with respect to SOG film was 40 degrees, the concentration was 1 weight %.

Figure 15:
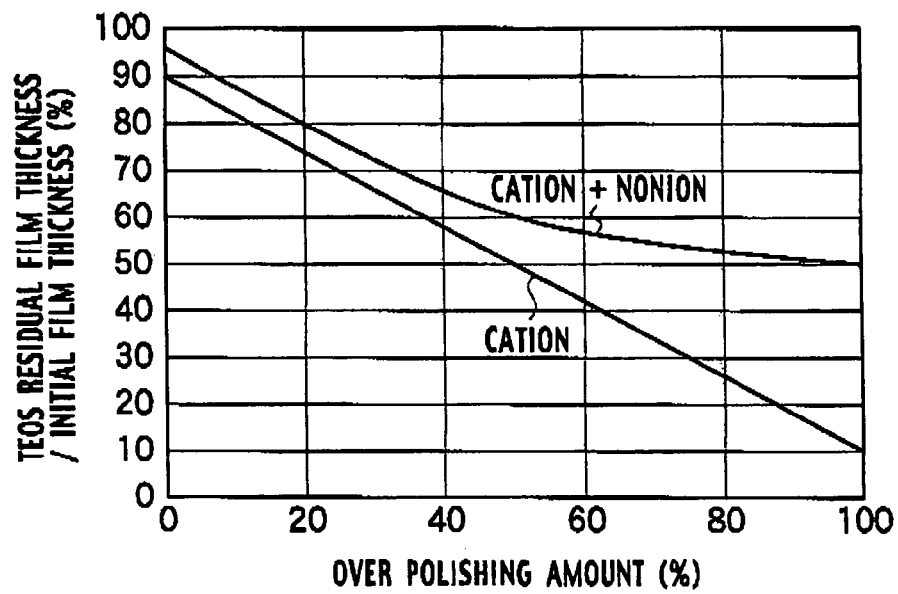
FIG. 15 is a graphic diagram illustrating TEOS residual film thickness/initial film thickness (%) when using cationic surfactant and nonionic surfactant.

CMP, using the CMP device that is produced by Ebara Corporation under the trade name of EPO-222, was performed under the conditions of that the load was 500 gf/cm$^2$; the back-side pressure was 450 gf/cm$^2$; the number of rotations of the top ring was 107 rpm; the number of rotations of the table was 100 rpm. There was overpolishing in a case when polishing time exceeded 60 seconds. In FIG. 15, the horizontal axis shows elapsed time as the amount (%) of overpolishing that occurred when the origin of the horizontal axis represents a polishing time of 60 seconds. As the polishing pad, the polishing pad that is produced by Rodel Company under the trade name of IC1000 was used as a hard quality of polishing pad the elastic modulus in compression of which was in the range of from 100 MPa to 600 MPa. As the slurry, there was used the slurry that was prepared in the way that the cerium oxide particles (produced by JSR Company under the trade name of "CMS4301") which had been produced with the fumed process and had a primary particle diameter of 35 nm and a secondary particle diameter of 250 nm, were blended into pure water serving as the solvent so as to have a concentration of 0.45 weight % based upon the total mass of slurry. As the sample substrate, there was used the sample substrate which was prepared similar to the manner explained in example 1. The results obtained are shown in FIG. 15.

As a result, with respect to the above-described thin-film sample, in a case where only the cationic surfactant alone was used, the margin with respect to the over-polish was narrow, it was difficult to leave the $SiO_2$ film as was. On the other hand, in a case where having concurrently used the cationic surfactant and nonionic surfactant, the margin with respect to the over-polish was sufficient, it was easy to leave the $SiO_2$ film as is. Since as stated above the SOG film is made hydrophilic through the addition of the second surfactant, the wettability of the $SiO_2$ film on the isolated wiring becomes increased and it is thought that, as a result of that, the cationic surfactant has been adsorbed to the $SiO_2$ film that has thereby been protected.

Figure 16:
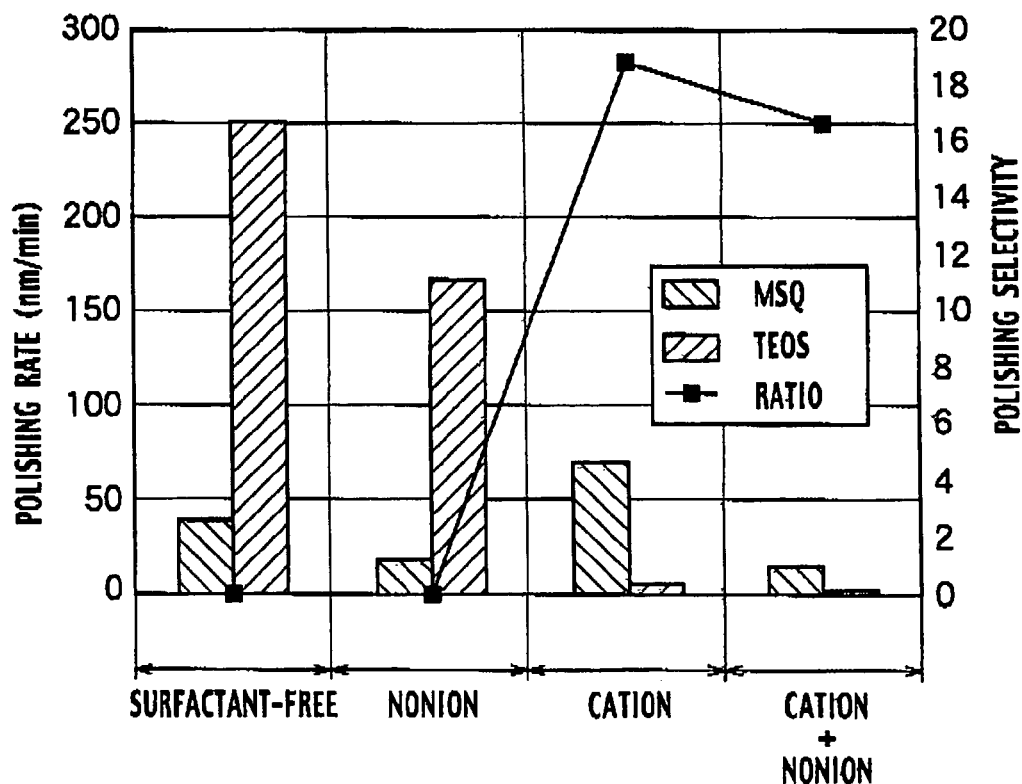
FIG. 16 is a graphic diagram illustrating the CMP polishing rate for each of the TEOS film and MSQ film and the polishing selectivity between these two films when making concurrent use of cationic surfactant and nonionic surfactant.

To evaluate those effects upon the polishing rate and polishing selectivity for the TEOS film and MSQ film that are brought about when making concurrent use of the cationic surfactant and nonionic surfactant, CMP was performed under the same conditions as in Example 1, excepting that as the surfactants there were used the ones that are illustrated in FIG. 16. As the surfactant, there was used the surfactant as same as used for measuring the TEOS residual film thickness/initial film thickness when overpolishing was performed as illustrated in FIG. 15. The results obtained are shown in FIG. 16.

From FIG. 16, it was proved that the polish for the TEOS film and MSQ film could be performed, in a case where concurrently using the cationic surfactant and nonionic surfactant, with a polishing selectivity similar to as when using the cationic surfactant alone as the surfactant.

What is claimed is:

1. A method of manufacturing a semiconductor device, comprising:
    depositing a $SiO_2$ film on a substrate having a wiring pattern thereon;
    coating a spin on glass film on the $SiO_2$ film; and
    polishing the spin on glass film using slurry containing cerium oxide and cationic surfactant with a chemical-mechanical polishing process,
    wherein a hydrophobic part of the cationic surfactant contained in the slurry is an oligomer or polymer having a mass average molecular weight of 500 or more, a pH value of the slurry is adjusted to a range of at least 4 but less than 7, and in the polishing the spin on glass film is chemically-mechanically polished selectively relative to the $SiO_2$ film until the surface of the $SiO_2$ film and the spin on glass film become level with each other.

2. The method of claim 1, wherein the $SiO_2$ film is formed from a tetraethoxysilane.

3. The method of claim 1, wherein the spin on glass is formed from a methyl silsesquioxane.

4. The method of claim 1, wherein the concentration of the cationic surfactant contained in the slurry is in a range of from 0.01 weight % inclusive to 10 weight % inclusive.

5. The method of claim 1, wherein the cationic surfactant contained in the slurry contains a quaternary ammonium salt.

6. The method of claim 1, wherein the polishing is executed, using a polishing pad having an elastic modulus in compression in a range of from 100 MPa and above to 600 MPa, while the substrate and the polishing pad are moved relative to each other.

7. The method of claim 1, wherein the polishing is executed, with the relative speed of the substrate to a polishing pad being in a range from 0.5 m/sec and above to 2.5 m/sec, while the substrate and polishing pad are moved relative to each other.

8. The method of claim 1, wherein the polishing is executed, with a pressure of the substrate with respect to a polishing pad being in a range from 200 gf/cm$^2$ and above to 700 gf/cm$^2$, while the substrate and polishing pad are moved relative to each other.

9. The method of claim 1, wherein the slurry further contains a second surfactant such that the contact angle with respect to the spin on glass film is less than 60 degrees.

10. The method of claim 1, wherein the $SiO_2$ film is deposited by an atmospheric CVD process, a thermal CVD process, or a plasma CVD process.

11. A method of manufacturing a semiconductor device, comprising:
    depositing a $SiO_2$ film on a substrate having a wiring pattern thereon;
    coating a spin on glass film on the $SiO_2$ film; and
    polishing the spin on glass film using slurry containing cerium oxide and cationic surfactant with a chemical-mechanical polishing process,
    wherein the slurry further contains at least one of acetylenediol-based nonionic surfactant or silicon-based nonionic surfactant such that the contact angle with respect to the spin on glass film is less than 60 degrees, and in the polishing the spin on class film is chemical-mechanically polished selectively relative to the $SiO_2$ film until the surface of the $SiO_2$ film and the spin on glass film become level with each other.

12. The method of claim 11, wherein the $SiO_2$ film is deposited by an atmospheric CVD process, a thermal CVD process, or a plasma CVD process.

13. A method of manufacturing a semiconductor device, comprising:

depositing a $SiO_2$ film on a substrate having a wiring pattern thereon;

coating a spin on glass film on the $SiO_2$ film; and polishing the spin on glass film using slurry containing cerium oxide and cationic surfactant with a chemical-mechanical polishing process, wherein the slurry further contains a second surfactant such that a contact angle with respect to the spin on glass film is less than 60 degrees, a concentration of the second surfactant in the slurry is in a range from 0.01 weight % inclusive to 10 weight % inclusive, a pH value of the slurry is adjusted to a range of at least 4 but less than 7, and in the polishing the spin on glass film is chemical-mechanically polished selectively relative to the $SiO_2$ film until the surface of the $SiO_2$ film and the spin on glass film become level with each other.

14. The method of claim 13, wherein the $SiO_2$ film is deposited by an atmospheric CVD process, a thermal CVD process, or a plasma CVD process.

* * * * *